(12) United States Patent　　(10) Patent No.: US 8,373,069 B2
Kariya et al.　　(45) Date of Patent: Feb. 12, 2013

(54) ELECTRONIC COMPONENT MOUNTING SUBSTRATE AND METHOD FOR MANUFACTURING ELECTRONIC COMPONENT MOUNTING SUBSTRATE

(75) Inventors: Takashi Kariya, Ogaki (JP); Daiki Komatsu, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 588 days.

(21) Appl. No.: 12/647,015

(22) Filed: Dec. 24, 2009

(65) Prior Publication Data

US 2010/0200279 A1　Aug. 12, 2010

Related U.S. Application Data

(60) Provisional application No. 61/141,132, filed on Dec. 29, 2008.

(51) Int. Cl.
*H05K 1/03*　(2006.01)

(52) U.S. Cl. ........ 174/255; 174/256; 174/258; 174/260; 174/261; 174/262; 361/765; 361/820; 438/106; 438/115; 438/612; 438/618; 438/658; 257/530; 257/704; 257/763; 257/774; 257/782

(58) Field of Classification Search .................. 174/255, 174/256, 258, 260–264; 361/765, 820; 438/106, 438/115, 612, 618, 658; 257/530, 704, 763, 257/774, 782

See application file for complete search history.

(56) References Cited

FOREIGN PATENT DOCUMENTS

JP　　2003-249601　　9/2003

OTHER PUBLICATIONS

U.S. Appl. No. 12/652,255, filed Jan. 5, 2010, Kariya, et al.

*Primary Examiner* — Xiaoliang Chen
(74) *Attorney, Agent, or Firm* — Oblon, Spivak, McClelland, Maier & Neustadt, L.L.P.

(57) ABSTRACT

An electronic component mounting substrate including a support layer made of resin with first and second surfaces, an organic insulation layer on the first surface of the support layer with a first surface on opposite side of the first surface of the support layer and a second surface in contact with the first surface of the support layer, an inorganic insulation layer on the first surface of the organic layer, a conductor on the second surface of the support layer, and a first conductive circuit on the second surface of the organic layer. The inorganic layer has a second conductive circuit and a pad for mounting an electronic component inside the inorganic layer. The organic layer has a via conductor inside the organic layer and connecting the first and second circuits. The support layer has a conductive post inside the support layer and connecting the first circuit and the conductor.

7 Claims, 21 Drawing Sheets

(a)

(b)

(c)

(d)

(a)

(b)

(c)

(a)

(b)

(c)

(a)

(b)

(a)

(b)

(a)

(b)

ELECTRONIC COMPONENT MOUNTING SUBSTRATE AND METHOD FOR MANUFACTURING ELECTRONIC COMPONENT MOUNTING SUBSTRATE

CROSS-REFERENCE TO RELATED APPLICATIONS

The present application claims the benefits of priority to U.S. Application No. 61/141,132, filed Dec. 29, 2008. The contents of that application are incorporated herein by reference in their entirety.

BACKGROUND OF THE INVENTION

1. Field of the Invention

The present invention is related to an electronic component mounting substrate and a method for manufacturing an electronic component mounting substrate.

2. Discussion of the Background

In Japanese Laid-Open Patent Publication 2003-249601, a substrate for a semiconductor device is disclosed in which fine wiring is formed on a silicon substrate. In the substrate described in Japanese Laid-Open Patent Publication 2003-249601, a mounting terminal connecting the front surface and the back surface of the silicon substrate is formed in the silicon substrate, and pyramid-shaped mounting terminals are formed by anisotropic etching, and the tip of a pyramid-shaped mounting terminal is connected to an electrode terminal of the semiconductor element. The contents of this publication are incorporated herein by reference in their entirety.

SUMMARY OF THE INVENTION

According to one aspect of the present invention, an electronic component mounting substrate includes a support layer made of a resin and having a first surface and a second surface on the opposite side of the first surface, an organic insulation layer formed on the first surface of the support layer and having a first surface and a second surface, the first surface of the organic insulation layer being on the opposite side of the first surface of the support layer, the second surface of the organic insulation layer being in contact with the first surface of the support layer, an inorganic insulation layer formed on the first surface of the organic insulation layer, a conductor formed on the second surface of the support layer and positioned to be mounted to a printed wiring board, and a first conductive circuit formed on the second surface of the organic insulation layer. The inorganic insulation layer has a second conductive circuit and a pad for mounting an electronic component which are formed inside the inorganic insulation layer. The organic insulation layer has a via conductor formed inside the organic insulation layer and electrically connecting the second conductive circuit in the inorganic insulation layer and the first conductive circuit. The support layer has a conductive post formed inside the support layer and electrically connecting the first conductive circuit and the conductor.

According to another aspect of the present invention, a method for manufacturing an electronic component mounting substrate includes forming an inorganic insulation layer on a support substrate, forming a second conductive circuit and a pad inside the inorganic insulation layer, forming at least one organic insulation layer on the inorganic insulation layer, forming a first conductive circuit inside the organic insulation layer or on the organic insulation layer while forming a via conductor electrically connecting the second conductive circuit and the first conductive circuit, forming a support layer on the organic insulation layer, forming a conductor on the support layer while forming inside the support layer a conductive post electrically connecting the conductor and the first conductive circuit, and removing the support substrate.

According to yet another aspect of the present invention, an electronic component mounting substrate includes a support layer made of a resin and having a first surface and a second surface on the opposite side of the first surface, an organic insulation layer formed on the first surface of the support layer and having a first surface and a second surface, the first surface of the organic insulation layer being on an opposite side of the first surface of the support layer, the second surface of the organic insulation layer being in contact with the first surface of the support layer, an inorganic insulation layer formed on the first surface of the organic insulation layer, a conductor formed on the second surface of the support layer and positioned to be mounted to a printed wiring board, and a first conductive circuit formed on the second surface of the organic insulation layer, and a capacitor formed on the first surface of the organic insulation layer. The support layer has a conductive post formed inside the support layer and electrically connecting the first conductive circuit and the conductor. The capacitor has a first electrode, a second electrode, and a dielectric layer formed between the first electrode and the second electrode. One of the first electrode and the second electrode is connected to a power-source line of a semiconductor element, and the other one of the first electrode and the second electrode is connected to a ground line.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
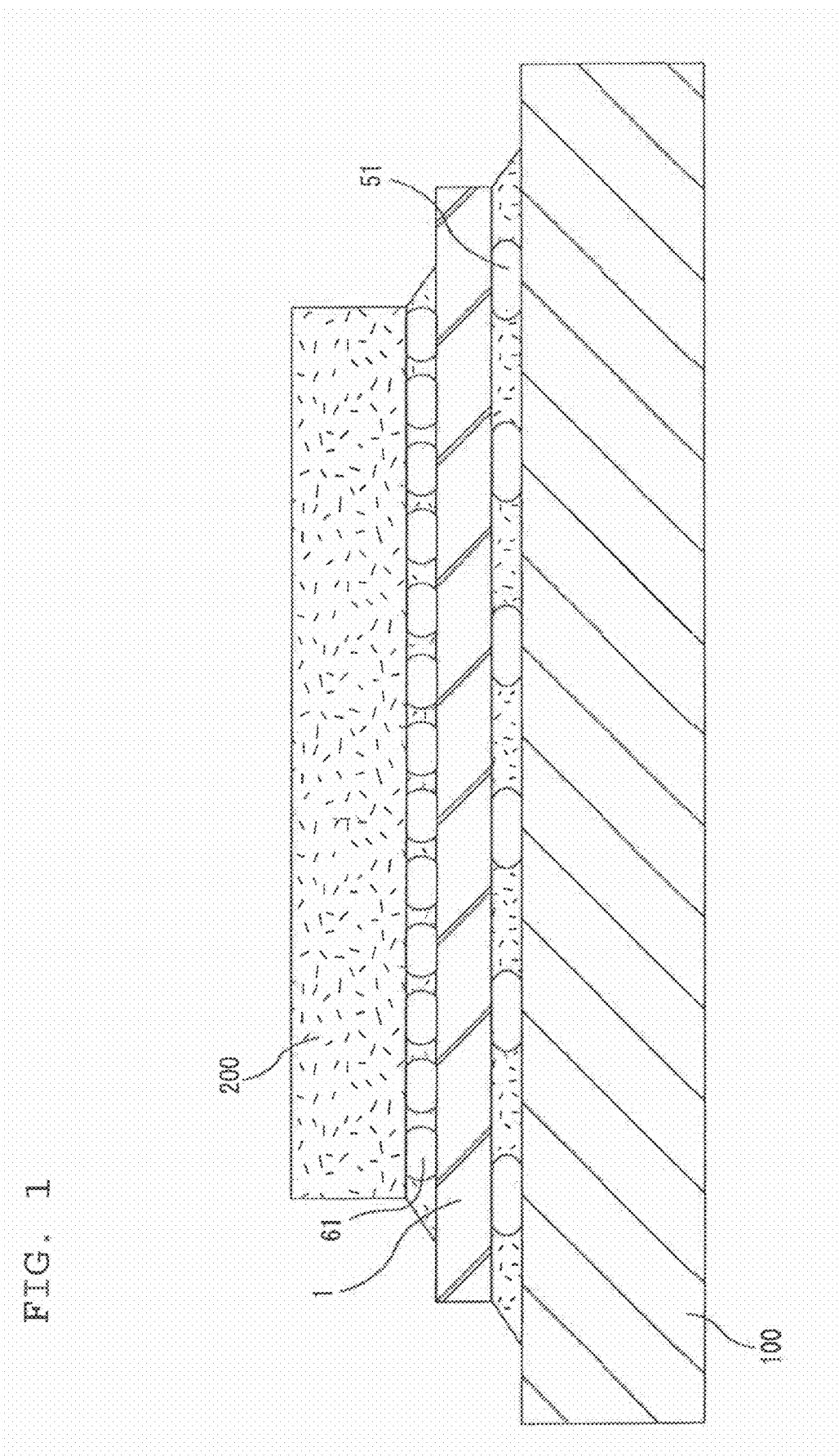
FIG. 1 is a schematic cross-sectional view showing an example in which an electronic component mounting substrate of the present invention is used.

The embodiments will now be described with reference to the accompanying drawings, wherein like reference numerals designate corresponding or identical elements throughout the various drawings.

First Embodiment

FIG. 1 is a cross-sectional view schematically showing an example in which an electronic component mounting substrate of the present invention is used.

As shown in FIG. 1, electronic component mounting substrate 1 of the present embodiment is arranged between electronic component 200 (each electronic component includes a semiconductor element such as logic and/or memory) and printed wiring board 100.

Electronic component 200 and electronic component mounting substrate 1 are connected by means of bumps 61, for example. Electronic component mounting substrate 1 and printed wiring board 100 are connected by means of bumps 51, for example.

Figure 2:
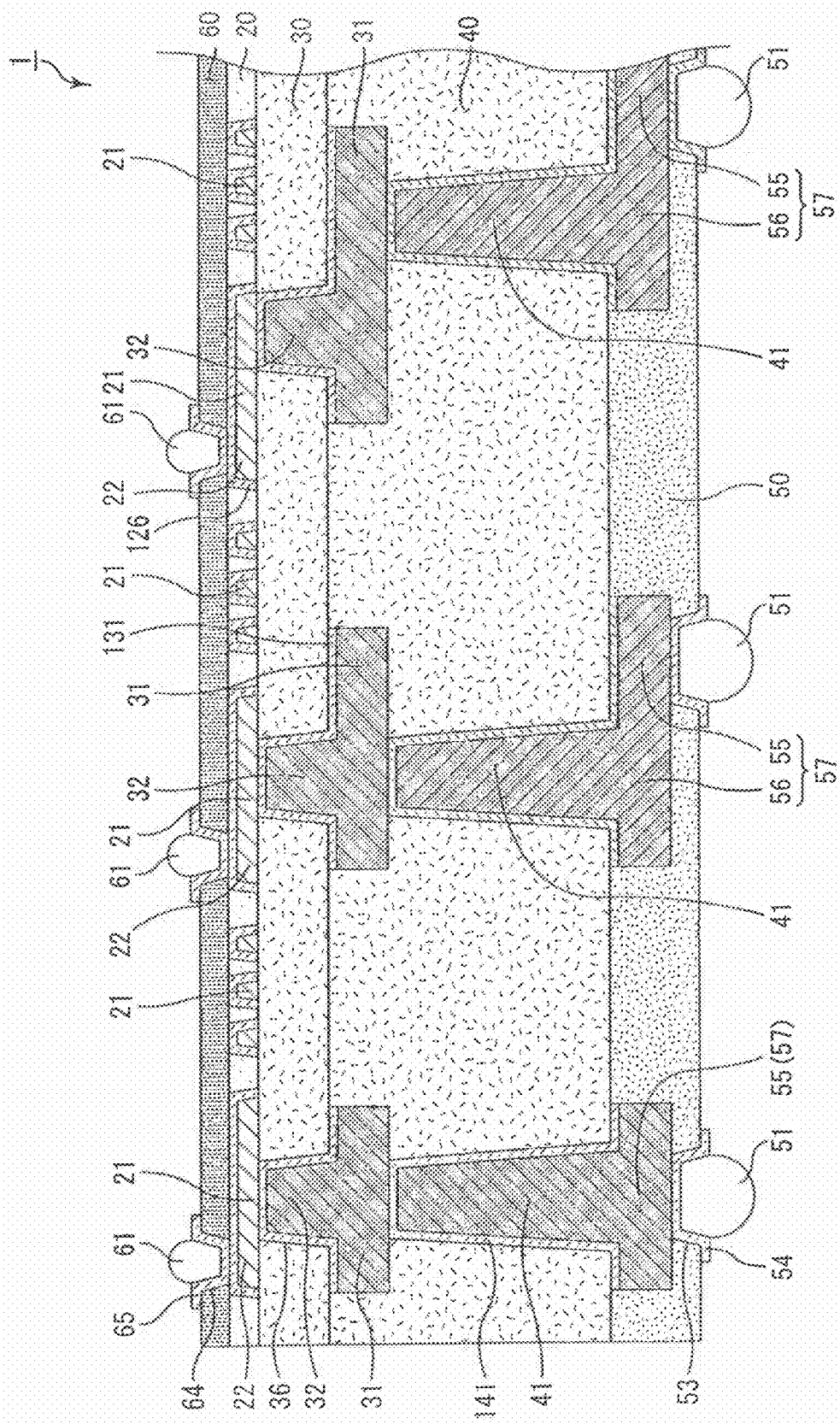
FIG. 2 is a schematic cross-sectional view partially showing an example of an electronic component mounting substrate of the present invention.

FIG. 2 is a cross-sectional view schematically showing part of an example of the electronic component mounting substrate of the present invention.

Electronic component mounting substrate 1 of the present embodiment has support layer 40, organic insulation layer 30 and inorganic insulation layer 20 listed in order from the bottom of FIG. 2. Regarding support layer 40, organic insulation layer 30 and inorganic insulation layer 20 in FIG. 2, the upper-side surface of each layer is referred to as the first surface, and the lower-side surface of each layer is referred to as the second surface.

On the first-surface side of support layer 40 and on the second surface of organic insulation layer 30 (bottom side of FIG. 2), first conductive circuits 31 are formed. On the second surface of support layer 40 (bottom side of FIG. 2), conductors 57 (third conductive circuits 56 and pads 55 in FIG. 2) are formed. Inside support layer 40, conductive posts 41 are formed. By means of conductive posts 41, first conductive circuits 31 and conductors 57 are electrically connected.

In protective film 50, openings 53 partially exposing conductors 57 are formed. Of conductors 57, the portion exposed through openings 53 function as pads 55. On pads 55, barrier-metal layer 54 is formed. On pads 55, bumps 51 are formed with barrier-metal layer 54 in between. Electronic component mounting substrate 1 is mounted on printed wiring board 100 by means of bumps 51 (see FIG. 3). Inorganic insulation layer 20 is made of $SiO_2$ (silicon dioxide). Inside inorganic insulation layer 20, pads 22 for mounting an electronic component and second conductive circuits 21 are formed. $Si_3N_4$ layer 60 formed on inorganic insulation layer 20 functions as protective film. In $Si_3N_4$ layer 60, openings 64 partially exposing pads 22 are formed. On pads 22, barrier-metal layer 65 is formed and bumps 61 are formed on pads 22 with barrier-metal layer 65 in between.

Figure 3:
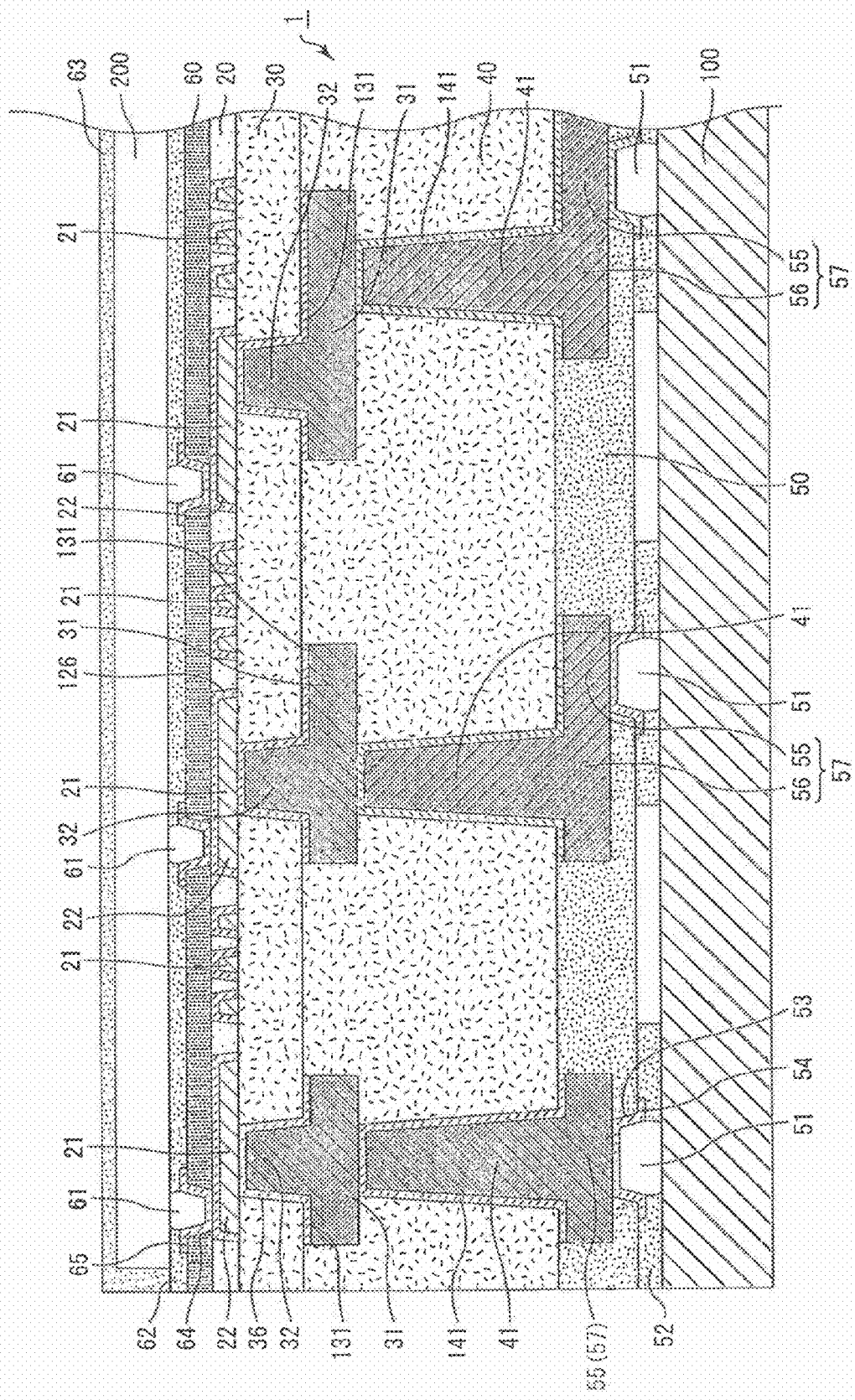
FIG. 3 is a schematic cross-sectional view showing an example in which an electronic component is mounted on the electronic component mounting substrate shown in FIG. 2, and the electronic component mounting substrate is further mounted on a printed wiring board.

Electronic component 200 is mounted on electronic component mounting substrate 1 by means of bumps 61 (see FIG. 3). Also, second conductive circuits 21 (pads 22) and first conductive circuits 31 are electrically connected by via conductors 32 formed inside inorganic insulation layer 30.

In the following, a detailed description of each portion will be provided in order from the bottom with reference to FIG. 2.

First, support layer 40 and conductive posts 41 are described.

Support layer 40 is made of resin. As the material for support layer 40, the following are listed: thermosetting resins such as epoxy resin, imide resin, phenol resin and silicon resin; and thermoplastic resins such as polyolefin resin, vinyl resin or imide resin in which a rubber ingredient (such as polybutadiene, silicon rubber, urethane, SBR or NBR) and an inorganic ingredient such as silica, alumina or zirconia are dispersed. The Young's modulus at 30° C. of the resin making the support layer is set in the range of 10-1,000 MPa.

Conductive posts 41 are pillar shaped conductors formed inside support layer 40 and are made of copper plating and seed layer 141 under the copper plating. If a printed wiring board that is usually made with organic material and an electronic component that is usually made with inorganic material are connected to respective surfaces of an electronic component mounting substrate, warping caused by temperature change will occur because of different coefficients of thermal expansion between the organic material and inorganic material. However, by arranging pillar shaped conductive posts in the support layer, such warping is relieved. As a result, stress will seldom concentrate in bumps, and cracks may be suppressed from occurring in bumps.

The height (thickness) of a conductive post is preferred to be set in the range of 20-400 μm. If the height of a conductive post is 20 μm or more, it is easier to relieve stress caused by the difference in thermal expansion coefficients between an electronic component mounting substrate and a printed wiring board. Also, it is preferred that the height of a conductive post be set at 400 μm or less, since such a conductive post may be easily formed by plating.

The diameter of a conductive post is preferred to be set in the range of 10-200 μm. In addition, the aspect ratio (height/diameter) of a conductive post is preferred to be set in the range of 4.0-6.5. The diameter of a conductive post is determined as follows: If the conductive post is configured to be a cylinder, then it is the diameter of the bottom surface; and if the conductive post is configured in other shapes, it is the maximum diameter of the diameters going through its gravity center.

Next, organic insulation layer 30, first conductive circuit 31 and via conductors 32 are described. Organic insulation layer 30 of the present embodiment is made of organic material and is formed on the first surface of support layer 40. Organic insulation layer 30 has openings 36, and via conductors 32 are formed in openings 36. Moreover, on the second surface of organic insulation layer 30 (a surface of organic insulation layer 30 on the first-surface side of support layer 40), first conductive circuits 31 are formed.

Organic insulation layer 30 is formed with resins such as thermosetting resins, photosensitive resins, thermosetting resins which include photosensitive groups, thermoplastic resins or a resin compound containing such resins. Specifically, organic insulation layer 30 is preferred to be made of photosensitive polyimide resin.

First conductive circuit 31 and via conductors 32 are made of copper plating and seed layer 131 under the copper plating. Regarding an example of how the seed layer is formed, it will be described in the paragraphs that describe a method for manufacturing an electronic component mounting substrate according to the present embodiment.

In the present embodiment, first conductive circuits 31 and via conductors 32 are formed by a semi-additive method, for example. The L/S of the wiring that forms first conductive circuits 31 is large compared with the L/S of the wiring that forms second conductive circuits 21. The L/S of wiring that forms the first conductive circuits of the present embodiment is L/S=3 μm/3 μm, but it is not limited to such. The L/S may be determined properly according to the number of wiring lines that form the first conductive circuits and the area of the region where the first conductive circuits are formed.

The thickness of first conductive circuits 31 is greater than that of second conductive circuits 21. The thickness of first conductive circuits 31 of the present embodiment is not limited to any specific value, but it is preferred to be set greater than 2 μm but no greater than 30 μm. If the thickness of first conductive circuits 31 is in such a range, warping may be suppressed in the electronic component mounting substrate, while the wiring resistance of first conductive circuits 31 is reduced. In addition, the thickness of the electronic component mounting substrate will not increase. Here, the thickness of a first conductive circuit indicates an average value obtained by selecting 10 cross sections at random in the direction of its length and by measuring them using a scanning electron microscope. The same is applied to the thickness of a second conductive circuit.

Also, the ratio of the thickness of first conductive circuits to the thickness of second conductive circuits (the thickness of first conductive circuits divided by the thickness of second conductive circuits) is greater than one but no greater than 15. If the ratio is one or smaller, the rigidity is not fully ensured in the electronic component mounting substrate, and warping may occur in the electronic component mounting substrate because of the different coefficients of thermal expansion between the electronic component and the electronic component mounting substrate. On the other hand, if the ratio exceeds 15, if their wiring widths are tentatively assumed to be the same, the aspect ratio of the first conductive circuits would increase. Thus, for example, if the organic insulation layer expands or contracts due to thermal history, the first conductive circuits will easily follow such expansion and contraction of the organic insulation layer. Accordingly, adhesiveness of the first conductive circuits to the organic insulation layer may decrease.

Also, the cross section of wiring that forms first conductive circuits 31 is preferred to be large compared with the cross section of wiring that forms second conductive circuits 21, preferably three to 10 times as large. By setting the cross section of wiring that forms the first conductive circuits to be larger, wiring resistance per unit length of the first conductive circuits will decrease. For example, if the aspect ratios of wiring that forms second conductive circuits 21 and wiring that forms first conductive circuits 31 are both 1:1, and if the L/S of wiring that forms the second conductive circuits is L/S=1 μm/1 μm, and the L/S of wiring that forms the first conductive circuits is L/S=3 μm/3 μm, then the cross section of the wiring that forms the first conductive circuits will be nine times as large as the cross section of the wiring that forms the second conductive circuits.

Via conductors 32 have side surfaces which taper from the second surface of the organic insulation layer (bottom side of FIG. 2) toward the first surface (top side of FIG. 2) so that their cross sections will decrease accordingly. Also, the diameter of via conductors 32 on the second-surface side is greater than the diameter on the first-surface side.

Also, the organic insulation layer positioned closest to inorganic insulation layer 20 is organic insulation layer 30. Inside organic insulation layer 30, only via conductors 32 are formed, and conductive circuits are not formed.

Next, inorganic insulation layer 20, second conductive circuits 21 and pads 22 are described.

Inorganic insulation layer 20 of the present embodiment is made of inorganic material and is formed on the first surface of organic insulation layer 30. Inside inorganic insulation layer 20, second conductive circuit 21 and pads 22 for mounting an electronic component are formed.

Inorganic insulation layer 20 of the present embodiment is a layer made of inorganic material such as $SiO_2$ (silicon dioxide). Regarding an example of a specific layer structure, it will be described in the paragraphs that describe a method for manufacturing an electronic component mounting substrate of the present embodiment. Forming inorganic insulation layer 20 is not limited to $SiO_2$, but a layer made of $Si_3N_4$ may also be used. Alternatively, the layer may be formed by laminating multiple layers using multiple kinds of inorganic materials such as $SiO_2$ or $Si_3N_4$ or the like.

Second conductive circuits 21 and pads 22 are made of copper plating and seed layer 126 under the copper plating. An example of forming the seed layer will be described in the paragraphs that describe a method for manufacturing an electronic component mounting substrate of the present embodiment.

In the present embodiment, second conductive circuits 21 and pads 22 are formed by a damascene method. The L/S of wiring that forms second conductive circuits 21 is small compared with the L/S of wiring that forms first conductive circuits 31. Here, the L/S of wiring that forms the second conductive circuits is not limited to any specific value, and is preferred to be approximately L/S=1 μm/1 μm, but it may be finer than such. The thickness of second conductive circuits 21 is smaller than the thickness of the first conductive circuits. The thickness of second conductive circuits 21 of the present embodiment is not limited to any specific value, but it is preferred to be 2 μm or smaller. If the thickness of second conductive circuits 21 is 2 μm or smaller, finer wiring may be achieved.

When mounting an electronic component, pads 22 are the portions to be connected to the connection terminals of the electronic component by means of bumps or the like. The surfaces of pads 22 are exposed from inorganic insulation layer 20 on the first surface-side of inorganic insulation layer 20, and are electrically connected to bumps 61. Bumps 61 are those used for mounting an electronic component.

Also, since second conductive circuits 21 and pads 22 are formed by a damascene method, the surface is made flat where inorganic insulation layer 20, second conductive circuits 21 and pads 22 are formed (the surface on the second-surface side of inorganic insulation layer 20).

Protective film 50 is described which is formed on the lower side of the electronic component mounting substrate of the present embodiment, namely, on the side on which a printed wiring board will be mounted.

Protective film 50 is formed on the second surface of support layer 40 (bottom side of FIG. 2). In protective film 50, pads 55 and third conductive circuits 56 are formed. Pads 55 and third conductive circuits 56 correspond to conductors 57 positioned on the second surface of the support layer.

Also, on pads 55 (bottom side of FIG. 2), openings 53 are formed, and bumps 51 made of solder are formed in openings 53 with barrier-metal layer 54 in between. The material for protective film 50 is not limited specifically, but organic material is preferred in view of its adhesiveness to support layer 40 made of resin.

Protective film 60 is described which is arranged on the upper side of the electronic component mounting substrate of the present embodiment, namely, on the side where an electronic component will be mounted.

Protective film 60 is formed on the first surface of inorganic insulation layer 20, and on second conductive circuits 21 and pads 22. Protective film 60 has openings 64 partially exposing pads 22. In openings 64, bumps 61 made of solder are formed with barrier-metal layer 65 in between.

By connecting bumps 61 to the connection terminals of an electronic component, the electronic component may be mounted on the electronic component mounting substrate. The material for protective film 60 is not limited specifically, but inorganic material such as $Si_3N_4$ is preferred to be used.

FIG. 3 is a cross-sectional view schematically showing an example where an electronic component is mounted on the electronic component mounting substrate shown in FIG. 2, and the electronic component mounting substrate is further mounted on a printed wiring board.

On the first-surface side of electronic component mounting substrate 1 shown in FIG. 3, electronic component 200 is mounted, and electronic component mounting substrate 1 with mounted electronic component 200 is mounted on printed wiring board 100 on its second-surface side.

On the first-surface side of the electronic component mounting substrate, terminals (not shown in the drawings) of electronic component 200 are electrically connected to the electronic component mounting substrate by means of bumps 61. Also, between electronic component 200 and electronic component mounting substrate 1, underfill resin 62 is filled. Moreover, electronic component 200 is encapsulated by encapsulation resin 63. Meanwhile, on the second-surface side of the electronic component mounting substrate, electronic component mounting substrate 1 is electrically connected to connection terminals (not shown in the drawings) of printed wiring board 100 by means of bumps 51. Also, underfill resin 52 is filled between printed wiring board 100 and electronic component mounting substrate 1.

In the following, a method for manufacturing an electronic component mounting substrate of the present embodiment is described with reference to the drawings. FIGS. 4a, 4b, 4c and 4d are cross-sectional views schematically showing parts of the steps for manufacturing an electronic component mounting substrate according to the First Embodiment.

Figure 4:
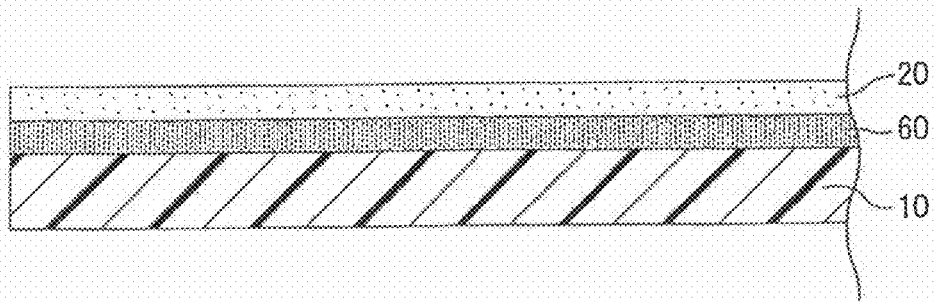
FIGS. 4a, 4b, 4c and 4d are schematic cross-sectional views partially showing steps for manufacturing an electronic component mounting substrate according to the first embodiment.
Figure 4:
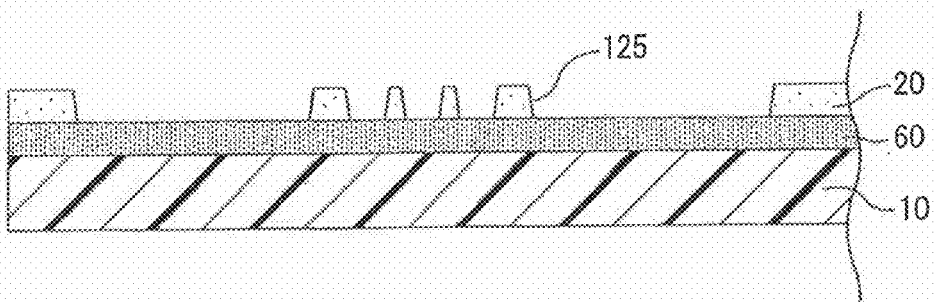
Figure 4:
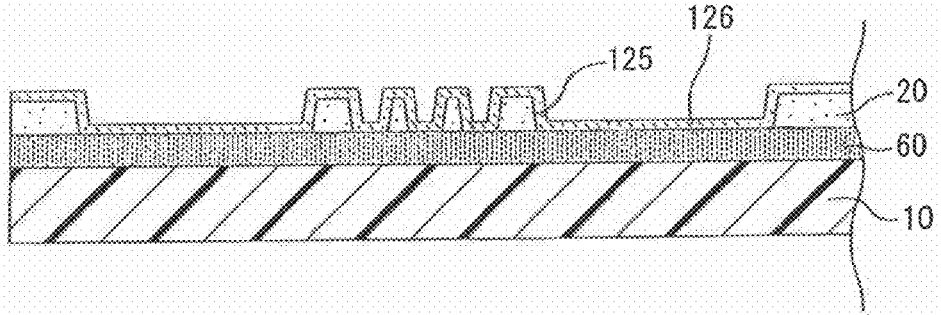
Figure 4:
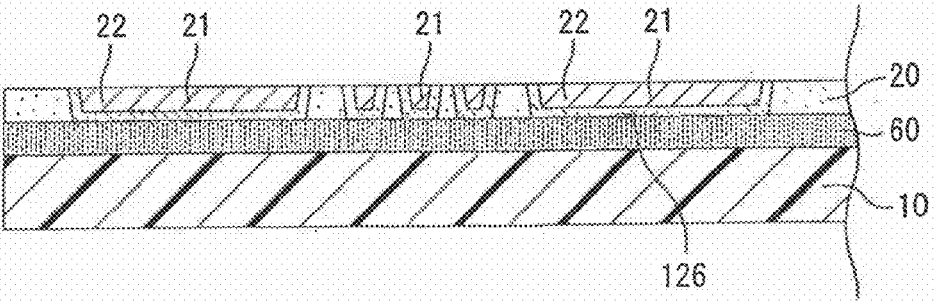

First, as shown in FIG. 4a, $Si_3N_4$ layer 60 which will become protective film and $SiO_2$ layer 20 which will become inorganic insulation layer 20 are formed on support substrate 10. As for support substrate 10 of the present embodiment, a silicon wafer is used. On support substrate 10, $Si_3N_4$ layer 60 and $SiO_2$ layer 20 are each formed using a chemical vapor deposition (CVD) method.

Next, resist is applied on predetermined spots of $SiO_2$ layer 20. Then, by exposure and development, the resist is removed from areas where openings are formed in $SiO_2$ layer 20. Dry etching is further conducted and openings 125 are formed (FIG. 4b). During such dry etching, $Si_3N_4$ layer 60 works as a stopper layer.

Next, as shown in FIG. 4c, on the exposed surface of $Si_3N_4$ layer 60 and the surface of inorganic insulation layer 20 (the surface of $SiO_2$ layer 20), seed layer 126 is formed by sputtering, for example. In the present embodiment, seed layer 126 is formed with sputtering films of TiN, Ti and Cu in that order from the bottom. However, the seed layer is not limited to such.

Next, electrolytic copper plating is performed using seed layer 126 as a power-supply layer to form an electrolytic copper-plated layer. Electrolytic copper plating is performed by a conventionally known method. In addition, chemical mechanical polishing (CMP) is conducted to remove the electrolytic copper-plated layer, and to remove seed layer 126 from the surface of $SiO_2$ layer 20. Here, the CMP is conducted using a method and apparatus known as a conventional damascene method. Then, the electrolytic copper-plated layer remaining after the CMP becomes second conductive circuits 21 and pads 22. The result of the steps taken so far is shown altogether in FIG. 4d. Through the steps so far, an inorganic insulation layer, second conductive circuits and pads may be formed.

FIGS. 5a, 5b and 5c and FIGS. 6a, 6b and 6c are cross-sectional views schematically showing parts of the steps for manufacturing an electronic component mounting substrate according to the first embodiment.

Figure 5:
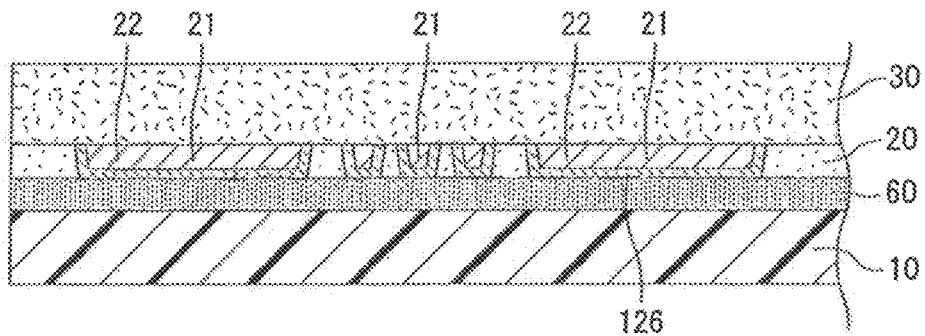
FIGS. 5a, 5b and 5c are schematic cross-sectional views partially showing steps for manufacturing an electronic component mounting substrate according to the first embodiment.
Figure 5:
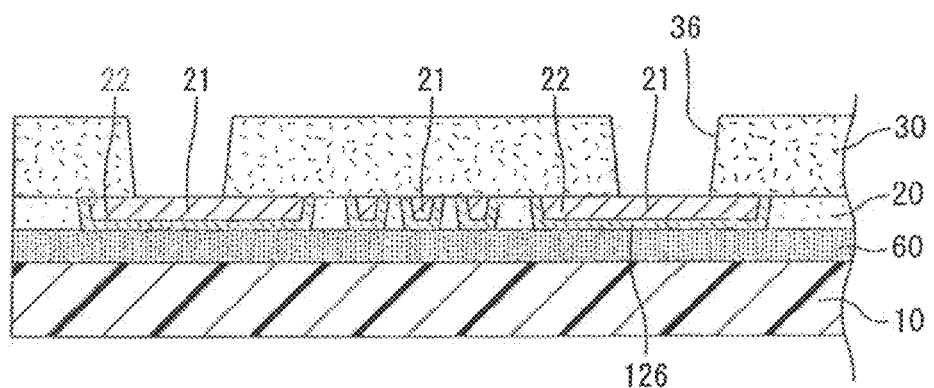
Figure 5:
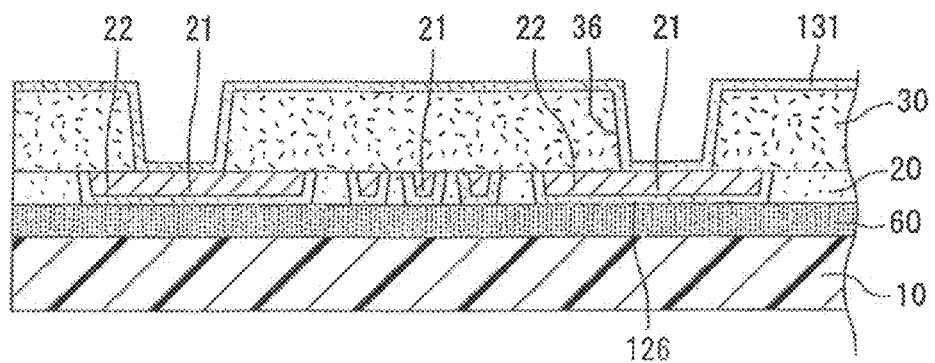

First, as shown in FIG. 5a, organic insulation layer 30 is formed on inorganic insulation layer 20 and second conductive circuits 21. Then, openings 36 are formed as shown in FIG. 5b. For forming organic insulation layer 30, for example, a method such as applying uncured photosensitive polyimide resin using a roll coater or the like may be used. When forming openings 36, an exposure and development treatment may be used.

Next, as shown in FIG. 5c, on the surface of organic insulation layer 30 (including the wall surfaces of openings 36) and the upper surfaces of second conductive circuits 21 exposed through openings 36, seed layer 131 is formed. Seed layer 131 is formed by sputtering, for example, and is made of Ti and Cu in the present embodiment. However, forming seed layer 131 is not limited to such.

Figure 6:
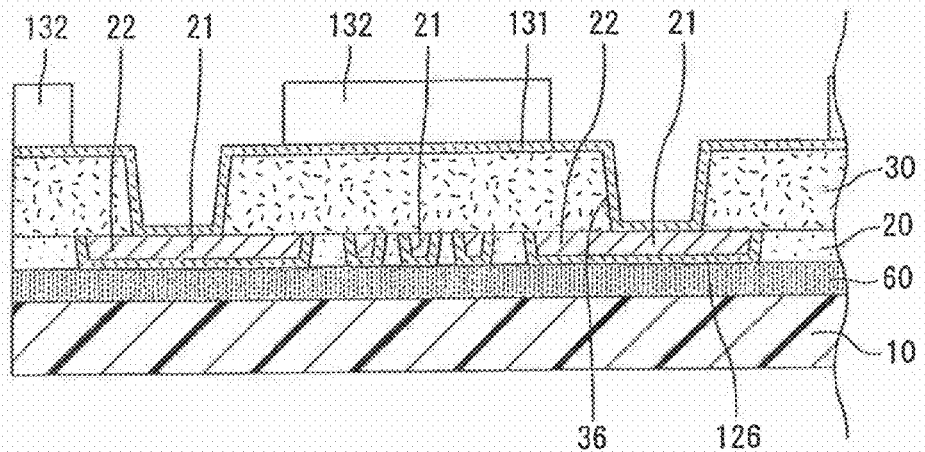
FIGS. 6a, 6b and 6c are schematic cross-sectional views partially showing steps for manufacturing an electronic component mounting substrate according to the first embodiment.
Figure 6:
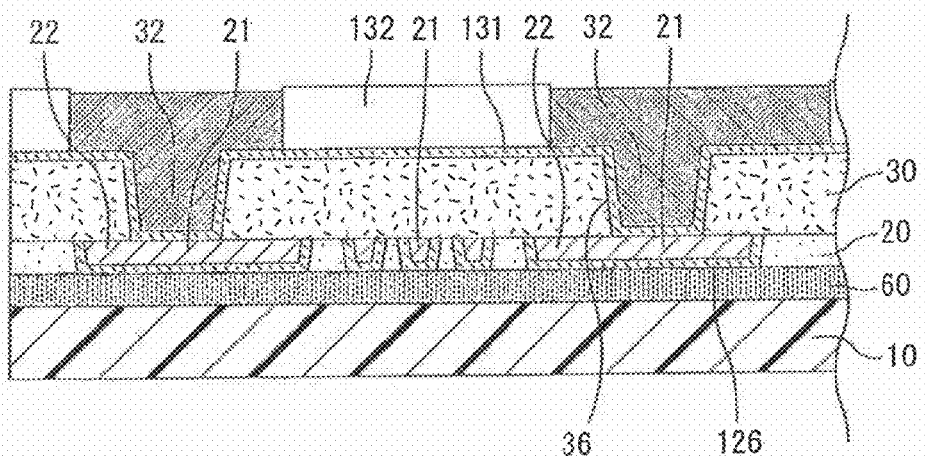
Figure 6:
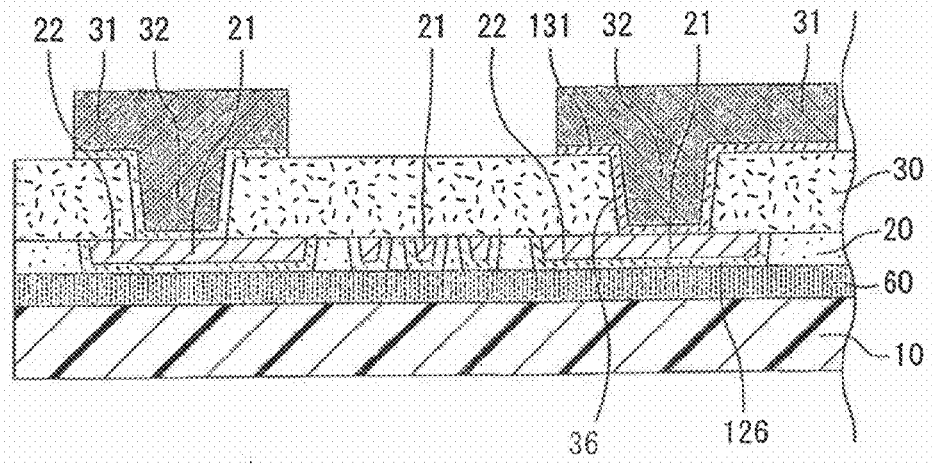

Next, as shown in FIG. 6a, plating resist 132 is formed. Then, by exposing to light and developing plating resist 132 through a mask, portions of plating resist 132 located in areas to form first conductive circuits are removed. As for the plating resist, for example, photosensitive dry film or the like may be used.

In the following, as shown in FIG. 6b, electrolytic copper plating is performed using seed layer 131 as the power-supply layer to form copper plating in areas where plating resist 132 is removed. By doing so, via conductors 32 are formed in organic insulation layer 30.

Next, as shown in FIG. 6c, remaining plating resist is removed, while seed layer 131 under the removed plating resist is also removed by etching. In doing so, first conductive circuits 31 are formed on organic insulation layer 30. Etching seed layer 131 is not limited to any specific method; however, dry etching (reactive ion etching) is preferred in view of the need to suppress over-etching of electrolytic copper plating. Through such steps, an organic insulation layer, first conductive circuits and via conductors may be formed.

Figure 8:
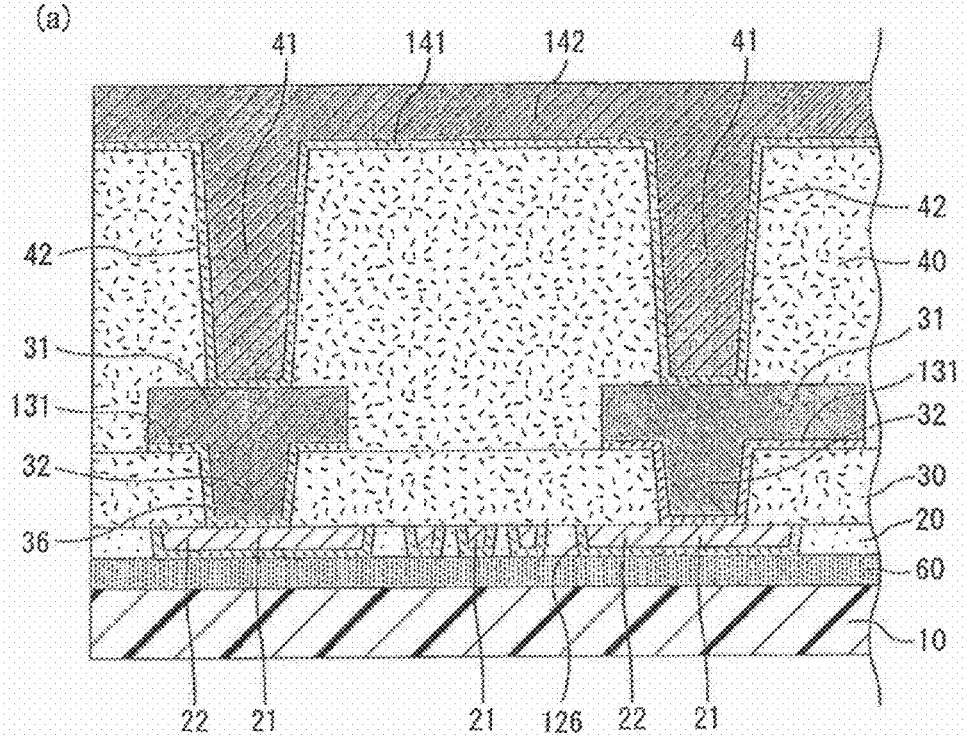
FIGS. 8a and 8b are schematic cross-sectional views partially showing steps for manufacturing an electronic component mounting substrate according to the first embodiment.
Figure 8:
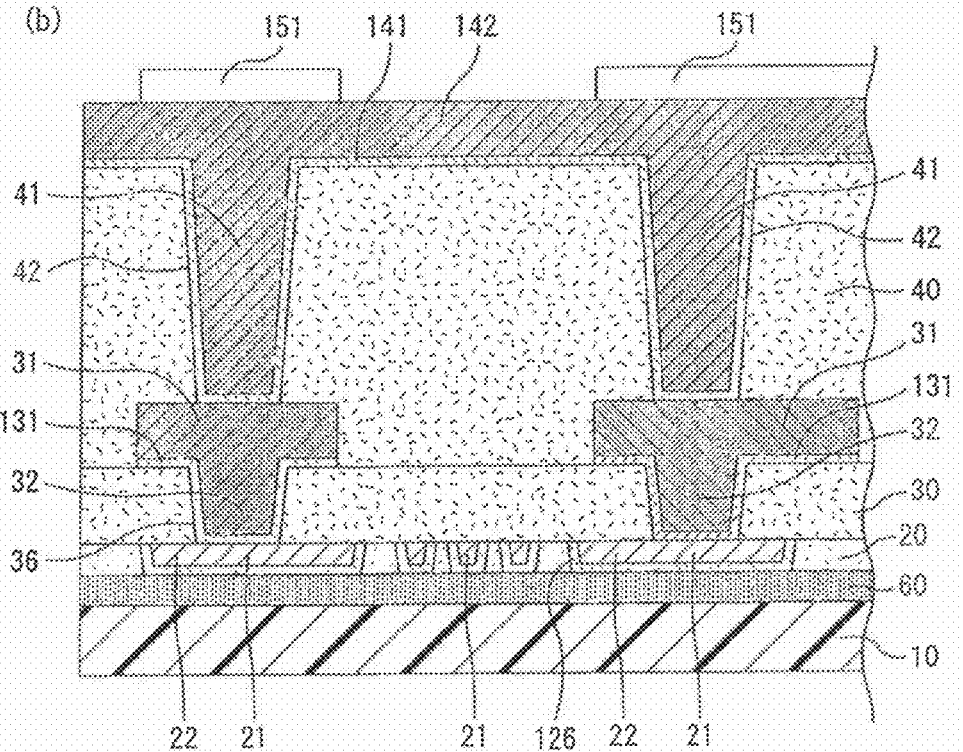
Figure 9:
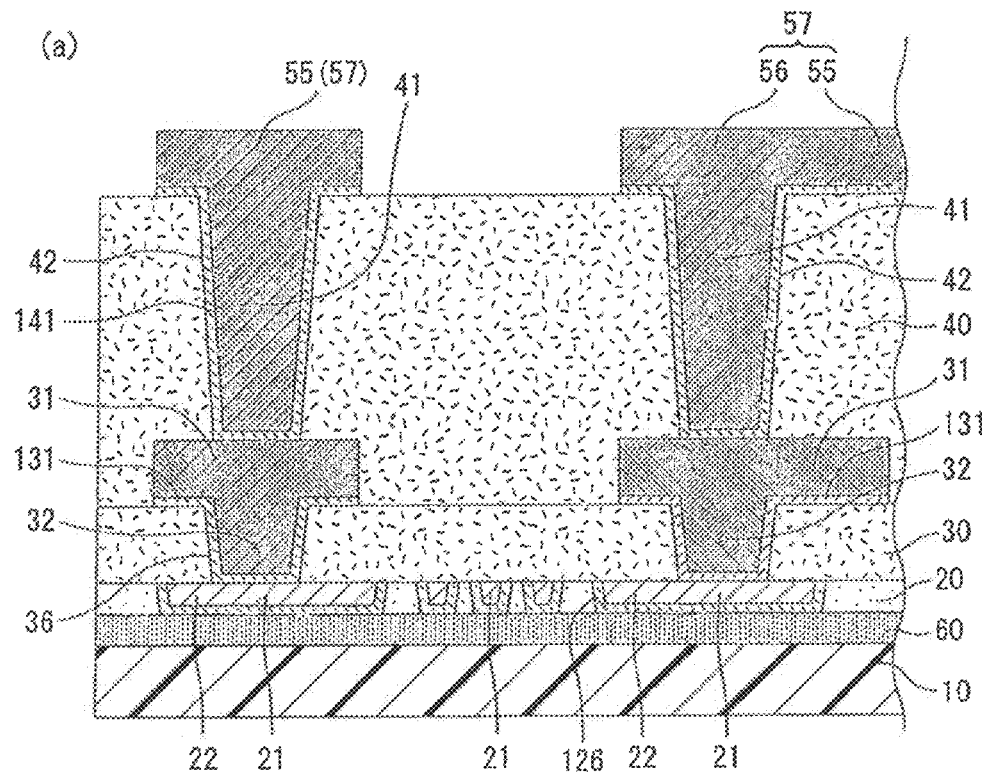
FIGS. 9a and 9b are schematic cross-sectional views partially showing steps for manufacturing an electronic component mounting substrate according to the first embodiment.
Figure 9:
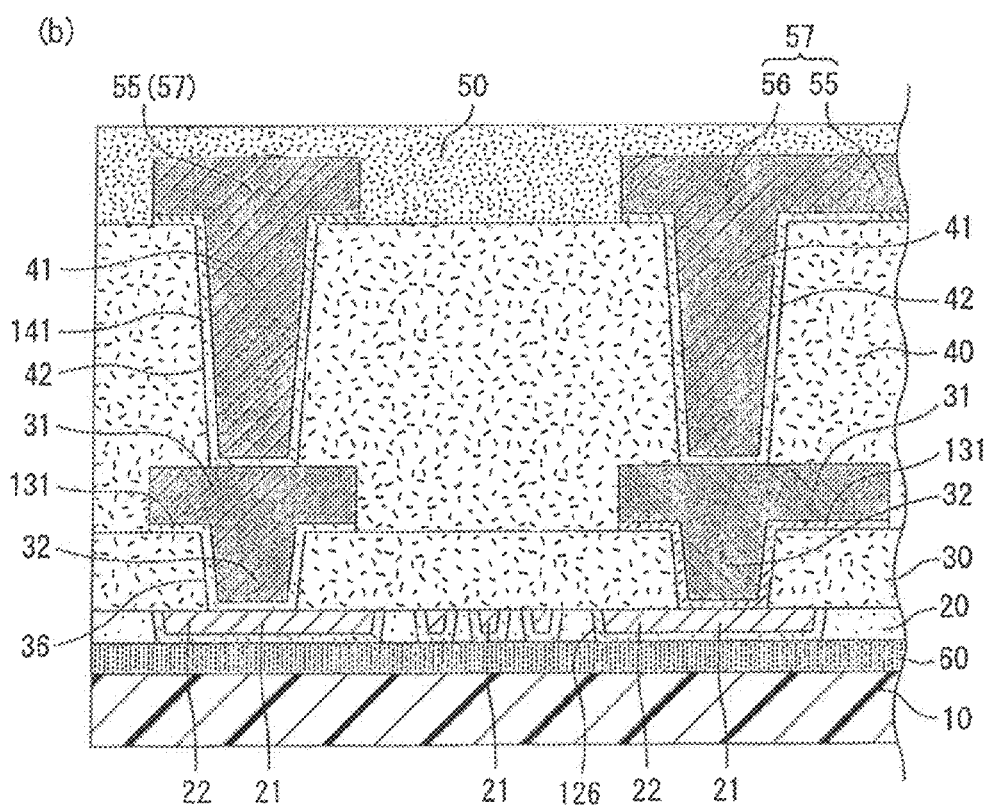
Figure 10:
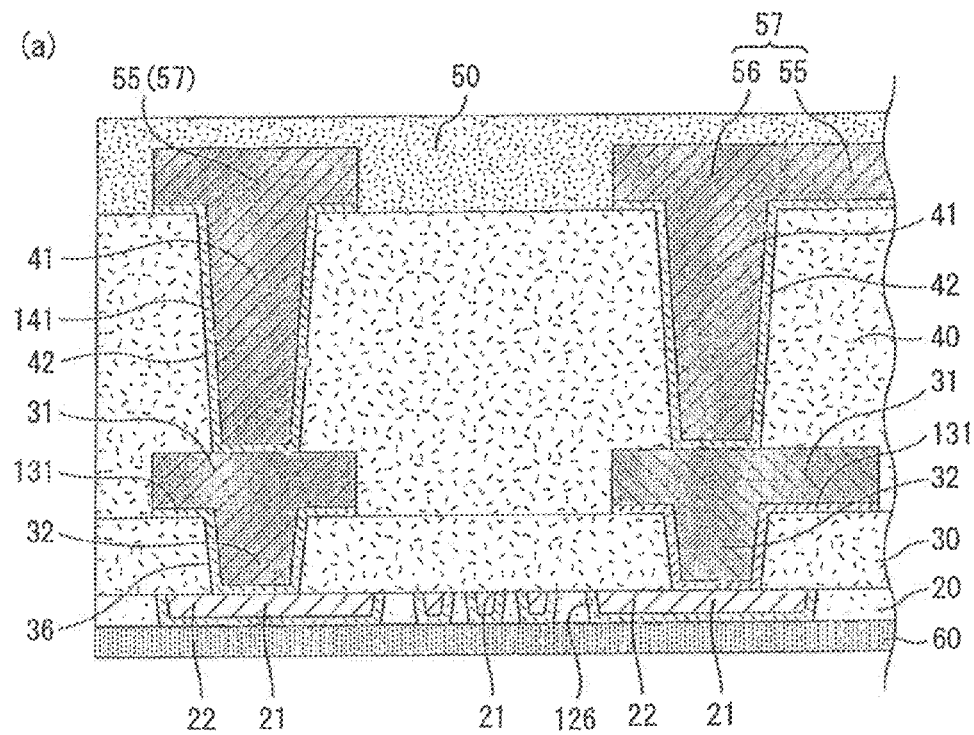
FIGS. 10a and 10b are schematic cross-sectional views partially showing steps for manufacturing an electronic component mounting substrate according to the first embodiment.
Figure 10:
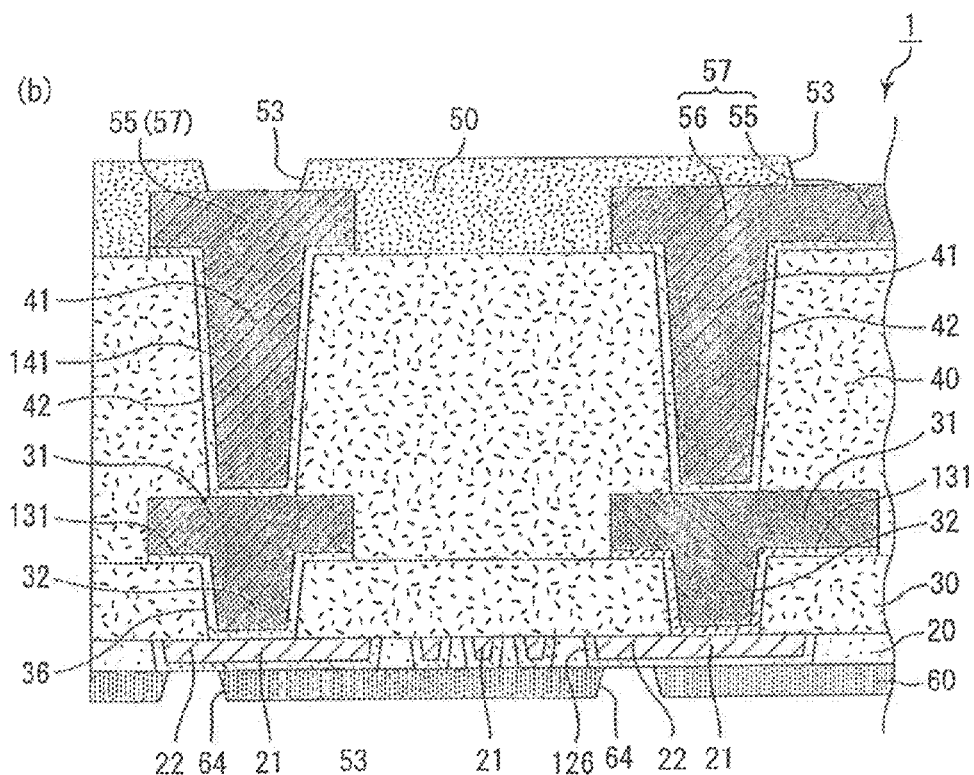

FIGS. 7a and 7b, FIGS. 8a and 8b, FIGS. 9a and 9b as well as FIGS. 10a and 10b are cross-sectional views schematically showing parts of the steps for manufacturing an electronic component mounting substrate according to the first embodiment.

First, on organic insulation layer 30, another organic insulation layer is further formed. The newly formed organic insulation layer becomes support layer 40. Then, at predetermined spots of support layer 40, openings 42 are formed. Forming openings 42 is not limited to any specific method, but a laser or photolithography may be used. When using a laser, alignment marks are formed on organic insulation layer 30. The result of the steps taken so far is shown altogether in FIG. 7a.

Figure 7:
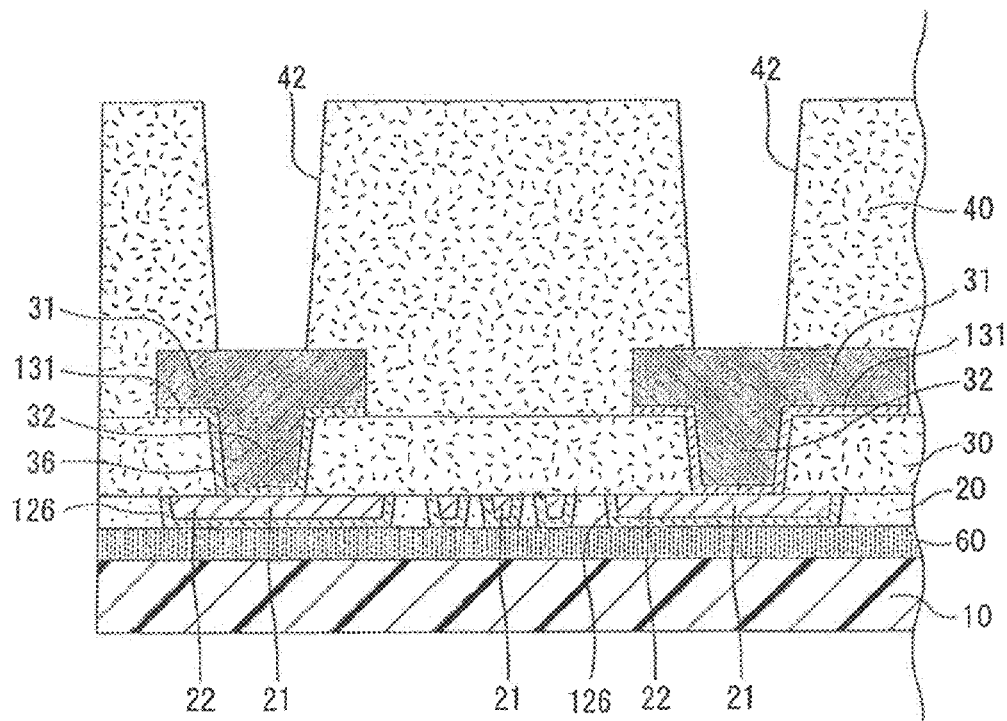
FIGS. 7a and 7b are schematic cross-sectional views partially showing steps for manufacturing an electronic component mounting substrate according to the first embodiment.
Figure 7:
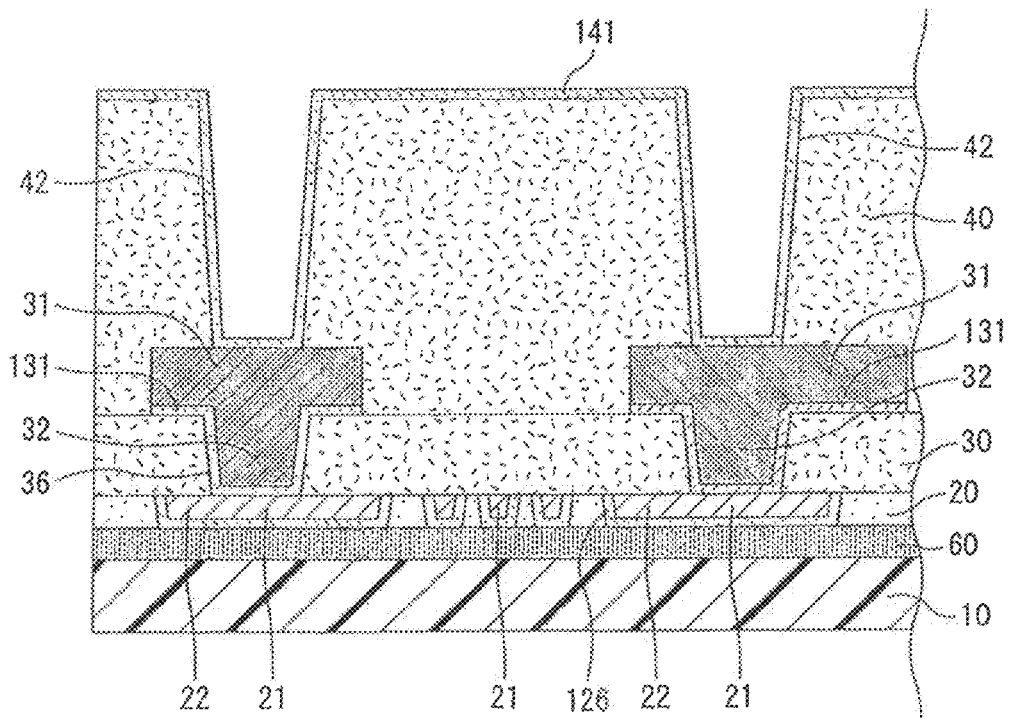

Next, as shown in FIG. 7b, seed layer 141 is formed in openings 42 formed in support layer 40. The structure of and method for seed layer 141 may be the same as the structure of and method for seed layer 131.

Next, as shown in FIG. 8a, electrolytic copper plating is performed using seed layer 141 as the power-supply layer to form electrolytic copper-plated layer 142 in openings 42 and on support layer 40. Of electrolytic copper-plated layer 142 formed by such a step, the portions formed in openings 42 become conductive posts 41.

Next, as shown in FIG. 8b, at predetermined spots of electrolytic copper-plated layer 142, resist 151 is formed. Then, as shown in FIG. 9a, portions of electrolytic copper-plated layer 142 in areas where resist 151 is not formed and seed layer 141 under such copper-plated layer are etched away. By such a step, portions of the electrolytic copper-plated layer remaining on the support layer become third conductive circuits 56 and pads 55. Furthermore, as shown in FIG. 9b, protective film 50 is formed to coat third conductive circuits 56 and pads 55.

In the following, as shown in FIG. 10a, support substrate 10 is removed (peeled). Removing the support substrate is not limited to any specific method, but grinding and etching may be used.

First, the first-surface side (the surface where the surface of the support substrate is exposed; the bottom side of FIG. 9b) of support substrate 10 made of silicon wafer is ground using a grinding apparatus to make the support layer thinner. The amount to be ground is not limited to any specific volume, but it is preferred to be ground until the support substrate becomes approximately 100 μm thick. As for a grinding apparatus, a grinder for silicon wafers is preferred to be used.

In the following, support substrate 10 (silicon wafer) which is made thinner by grinding is completely removed by etching using an etchant containing potassium hydroxide or the like. A solution for etching is not limited to any specific type as long as it is used for etching silicon wafers. For example, a potassium hydroxide solution or the like may be used. An apparatus for etching is not limited to any specific type, but an apparatus for wet etching of silicon wafers is preferred to be used. Also, before inorganic insulation layer 20 is formed on support substrate 10 (silicon wafer) in FIG. 4a, a removable layer may be formed on the surface of support substrate 10. As the material for such a removable layer, metals such as Cu, Ni or the like or resin may be used. In such a case, when removing support substrate 10, the electronic component mounting substrate and the support substrate may be separated easily using the removable layer. Such a method is not limited specifically, but etching is used if the removable layer is metal. If the removable layer is resin, alkaline dissolution or the like may be employed. In such a case, support substrate 10 (silicon wafer) may be used again.

In the following, as shown in FIG. 10b, openings 53 are formed in protective film 50 to expose pads 55. Then, as shown in FIG. 10b, openings 64 are formed in protective film 60 ($Si_3N_4$ layer 60). Forming such openings is not limited to any specific method, but a laser or photolithography may be used.

By the steps described above, electronic component mounting substrate 1 of the present invention may be manufactured. On the first-surface side of electronic component mounting substrate 1 (bottom side of FIG. 10b), surfaces of pads 22 are exposed, and an electronic component may be mounted on pads 22.

Meanwhile, on the second-surface side of electronic component mounting substrate 1 (top side of FIG. 10b), the surfaces of pads 55 are exposed. Electronic component mounting substrate 1 may be mounted on a printed wiring board by means of pads 55.

In the following, steps are described for mounting an electronic component on the electronic component mounting substrate of the present embodiment, and further mounting the electronic component mounting substrate on a printed wiring board.

Figure 11:
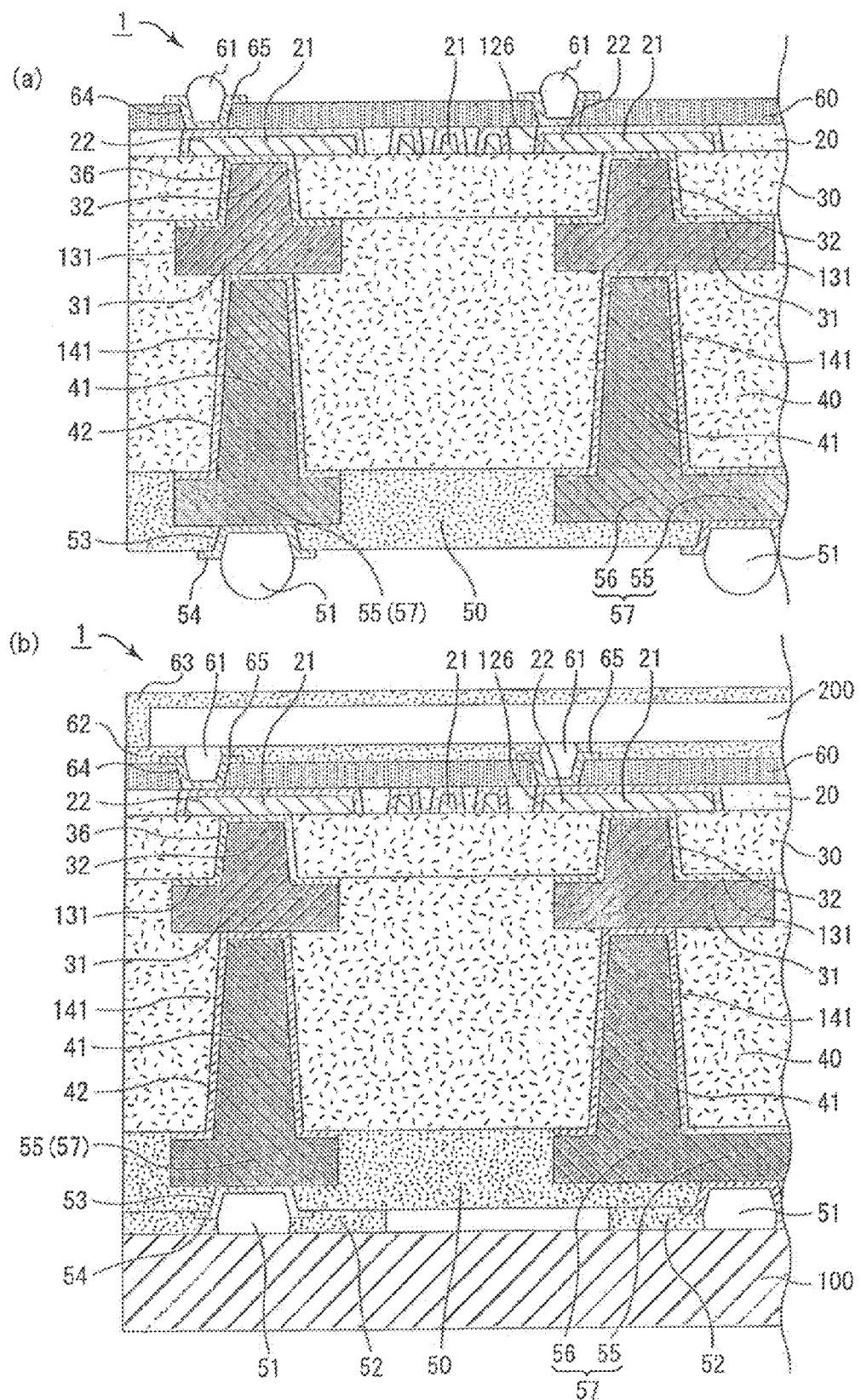
FIGS. 11a and 11b are schematic cross-sectional views showing steps of mounting an electronic component on an electronic component mounting substrate of the first embodiment, and the electronic component mounting substrate is further mounted on a printed wiring board.

FIGS. 11a and 11b are cross-sectional views schematically showing steps for mounting an electronic component on the electronic component mounting substrate of the first embodiment, and further mounting the electronic component mounting substrate on a printed wiring board.

FIGS. 11a and 11b are viewed upside-down from the view in FIG. 10b. The same as in FIGS. 2 and 3, the first surface of each layer faces up and the second surface of each layer faces down.

FIG. 11a is a view schematically showing that barrier-metal layer and bumps are formed on both surfaces of electronic component mounting substrate 1.

First, barrier-metal layer 65 is formed in openings 64 in protective film 60. Barrier-metal layer 65 is formed by sputtering, for example, tantalum nitride and tantalum in that order. However, the material of and a method for forming barrier-metal layer 65 are not limited specifically. Although omitted in the drawings, on the surface of barrier-metal layer 65 exposed through openings 64 of protective film 60, Ni/Au plating is performed. That is for ensuring adhesiveness between solder and pads when solder bonding is conducted as described later. In the following, bumps 61 made of solder are formed on barrier-metal layer 65.

In openings 53 formed in protective film 50 on the second-surface side of electronic component mounting substrate 1, barrier-metal layer 54 is formed and bumps 51 made of solder are formed on barrier-metal layer 54, the same as on the above-described first-surface side.

In the following, electronic component 200 is flip-chip mounted on electronic component mounting substrate 1 by means of bumps 61 formed on the first-surface side of electronic component mounting substrate 1. Next, underfill resin 62 is filled between electronic component 200 and electronic component mounting substrate 1 and is cured. Then, the periphery of mounted electronic component 200 is encapsulated by encapsulating resin 63. Moreover, electronic component mounting substrate 1 is mounted on printed wiring board 100 by means of bumps 51 formed on the second-surface side of electronic component mounting substrate 1. Then, underfill resin 52 is filled between printed wiring board 100 and electronic component mounting substrate 1 and is cured. The result of the steps taken so far is shown altogether in FIG. 11b.

As for underfill resin and encapsulating resin, well-known resins may be used. Using the steps so far, an electronic component mounting substrate is manufactured in such a way that an electronic component is mounted on the first-surface side, and the second-surface side is used to mount the substrate on a printed wiring board.

When an electronic component mounting substrate is formed using a silicon wafer as its support substrate, by using a silicon wafer sufficiently large relative to the size of an electronic component mounting substrate, multiple electronic component mounting substrates may be formed from one sheet of silicon wafer. If multiple electronic component mounting substrates are formed from one sheet of silicon wafer, at an appropriate step such as before or after a step to mount an electronic component, the silicon wafer is cut by dicing or the like so that electronic component mounting substrates may be divided into units. In doing so, electronic component mounting substrates may be efficiently manufactured.

In the following, listed are effects of an electronic component mounting substrate and a method for manufacturing such an electronic component mounting substrate according to the present embodiment.

(1) In an electronic component mounting substrate of the present embodiment, a support layer made of resin is arranged and conductive posts are formed in the support layer. The electronic component mounting substrate may be mounted on a printed wiring board on the second-surface side of the support layer in the electronic component mounting substrate. Accordingly, stress generated due to different coefficients of thermal expansion between the electronic component mounting substrate and the printed wiring board may be relieved by the conductive posts. Thus, such stress seldom concentrates on the bumps used for mounting the electronic component mounting substrate on the printed wiring board, and cracks may be suppressed from occurring in the bumps. As a result, the mounting reliability of the electronic component mounting substrate may be ensured.

Meanwhile, an organic insulation layer is formed on the first-surface side of the support layer and an inorganic insulation layer is formed on the organic insulation layer. In addition, pads for mounting an electronic component are formed inside the inorganic insulation layer. Such pads are wired by fine wiring using the second conductive circuits formed in the inorganic insulation layer, and are fine-pitched. Therefore, an electronic component, especially a semiconductor element with fine-pitched terminals (electrodes), may be mounted on the pads formed in the inorganic insulation layer.

(2) Since fine wiring may be formed inside the inorganic insulation layer, by forming fine wiring using the second conductive circuits formed in the inorganic insulation layer, it is not necessary to increase the number of layers to gradually fan out the wiring. Accordingly, fine-pitch terminals of an electronic component may be dealt with using fewer layers.

(3) On the first-surface side of the electronic component mounting substrate of the present embodiment, an inorganic insulation layer is formed. Thus, an electronic component such as a fine-pitch semiconductor element may be mounted on the electronic component mounting substrate to be positioned closer to the inorganic insulation layer. Since such an electronic component is usually formed with inorganic material such as silicon, the difference in thermal expansion coefficients between the electronic component and the electronic component mounting substrate decreases, and the mounting reliability may be enhanced.

(4) First conductive circuits are formed on the second surface (the side facing the support layer) of the organic insulation layer. The first conductive circuits are electrically connected to the second conductive circuits on one end, and are electrically connected to conductive posts on the other end. Using the first conductive circuits, wiring may be distributed in areas where fine wiring using the second conductive circuits is not required. Since wiring that is not fine wiring has less wiring resistance than fine wiring, by forming the first conductive circuits, the wiring resistance of the entire electronic component mounting substrate may be decreased.

(5) The thickness and cross section of the wiring that forms first conductive circuits are greater than the thickness and cross section of the wiring that forms the second conductive circuits. Therefore, the wiring resistance of the wiring that forms the first conductive circuits decreases. Accordingly, by forming the first conductive circuits, the wiring resistance of the entire electronic component mounting substrate may be decreased.

(6) In the organic insulation layer located closest to the inorganic insulation layer, only via conductors are formed, and conductive circuits are not formed. The organic insulation layer (outermost organic insulation layer) located closest to the inorganic insulation layer tends to be affected by thermal history caused by heat generated in the electronic component, and thus cracks tend to occur in that area. However, in the structure according to the present embodiment, conductive circuits are not formed in the outermost organic insulation layer. Thus, cracks may be suppressed from occurring in the organic insulation layer.

(7) In the method for manufacturing an electronic component mounting substrate according to the present embodiment, an electronic component mounting substrate may be manufactured, characterized by high mounting reliability when a semiconductor element having fine-pitch terminals (electrodes) is mounted on one surface, while using the other surface the substrate is mounted on a printed wiring board.

(8) In the method for manufacturing an electronic component mounting substrate according to the present embodiment, the second conductive circuits are formed by a damascene method and the first conductive circuits by a semi-additive method. Accordingly, an electronic component mounting substrate may be manufactured in such a way that, by making it fine wiring, the wiring that forms the second conductive circuits is formed accurately and highly flat, while the first conductive circuits with low wiring resistance are easily formed.

(9) In the method for manufacturing an electronic component mounting substrate according to the present embodiment, after openings are formed in the support layer to partially expose the first conductive circuits, conductive posts are formed in the openings. By such steps, conductive posts with a large aspect ratio may be formed well.

Second Embodiment

In an electronic component mounting substrate of the present embodiment, the configuration of the conductors positioned on the second surface of the support layer differs from that in an electronic component mounting substrate of the first embodiment.

Figure 12:
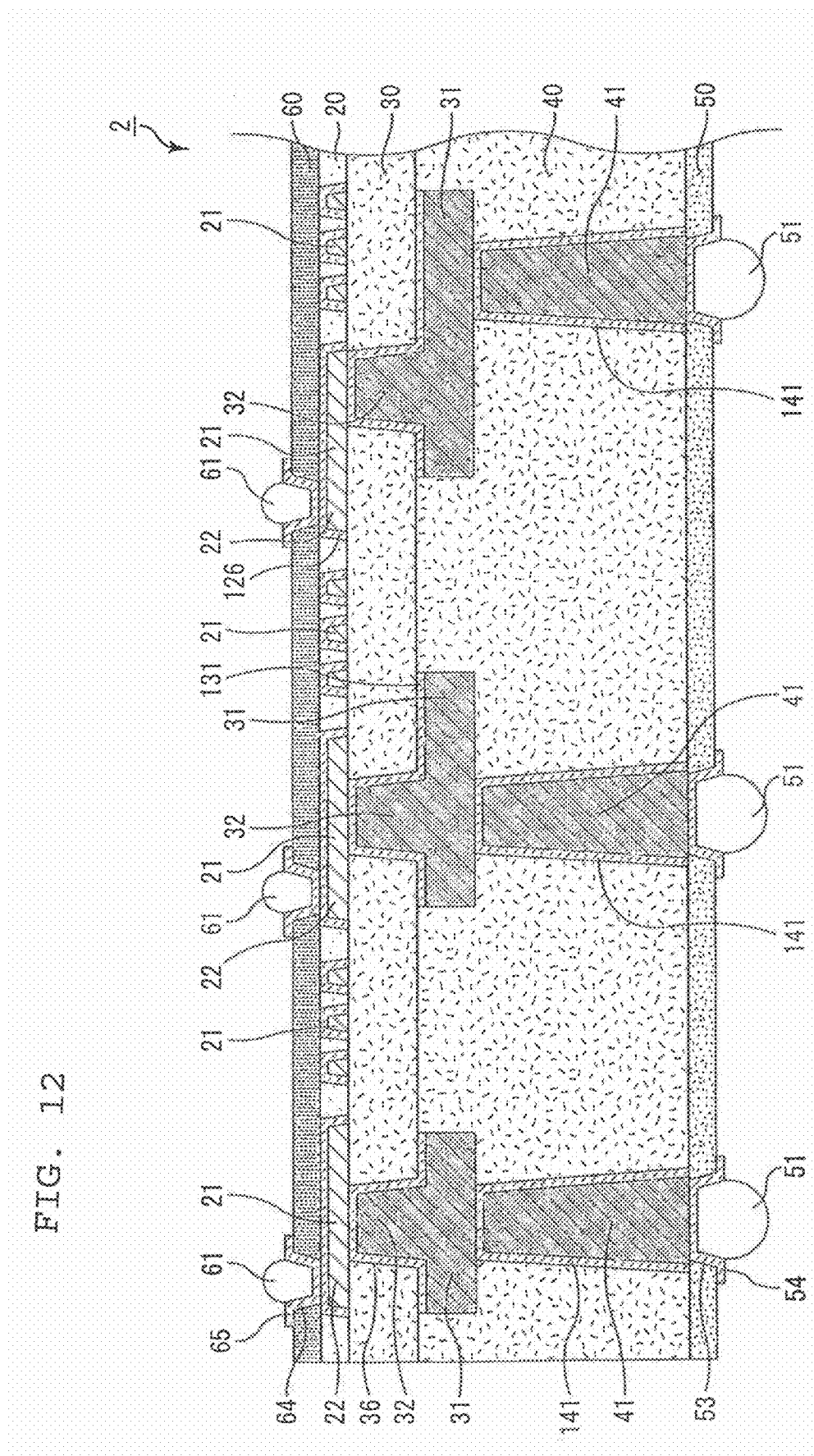
FIG. 12 is a schematic cross-sectional view partially showing another example of an electronic component mounting substrate of the present invention.

FIG. 12 is a cross-sectional view schematically showing part of another example of the electronic component mounting substrate of the present invention. In electronic component mounting substrate 2 according to the second embodiment, third conductive circuits and pads are not formed on the second surface of support layer 40. Protective film 50 is formed on the second surface of support layer 40.

Opening 53 is formed in protective film 50, and in opening 53, barrier-metal layer 54 is formed and bump 51 is further formed. Directly under opening 53 with bump 51 (top side of FIG. 12), an end of conductive post 41 is positioned. Namely, in the present embodiment, the conductor located on the second surface of the support layer is bump 51 (including barrier-metal layer 54). Bump 51 and first conductive circuit 31 are electrically connected by conductive post 41. If formed as such, electronic component mounting substrate 2 may be mounted on a printed wiring board by means of bumps 51.

In FIG. 12, each layer located on and above support layer 40 is formed the same as in the electronic component mounting substrate of the first embodiment. Thus, its detailed description is omitted here.

Figure 13:
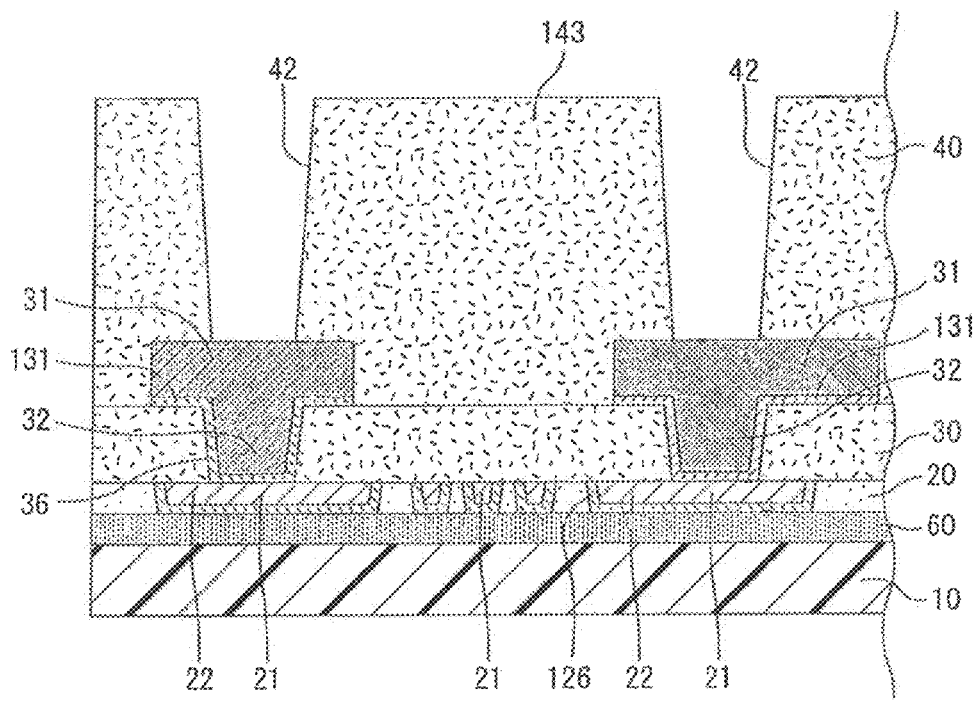
FIGS. 13a and 13b are schematic cross-sectional views partially showing steps for manufacturing an electronic component mounting substrate according to the second embodiment.
Figure 13:
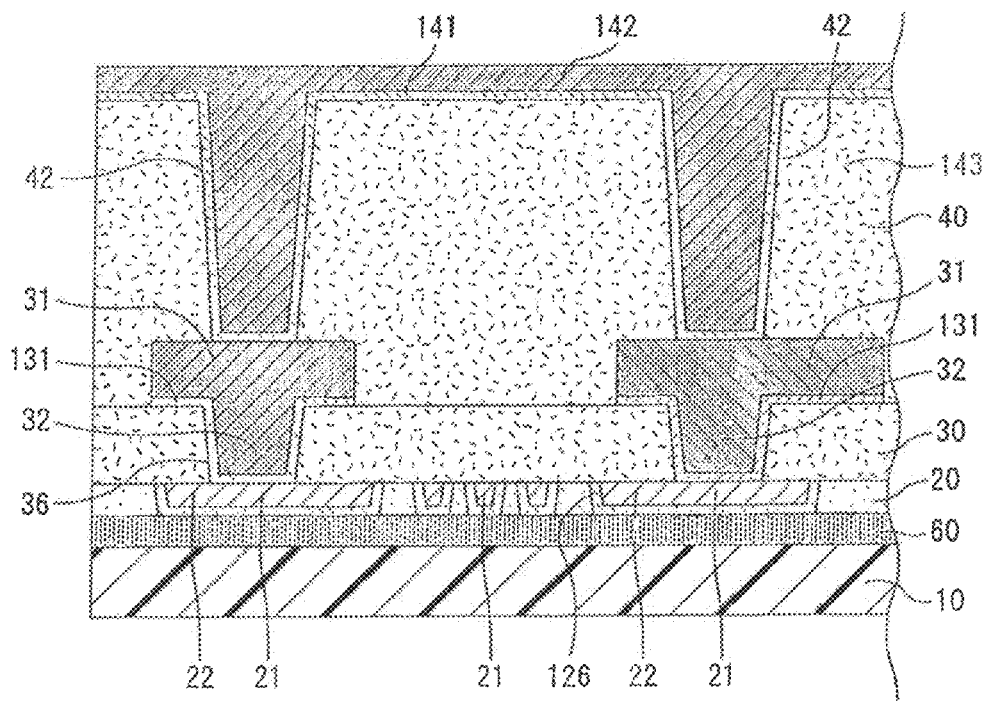
Figure 14:
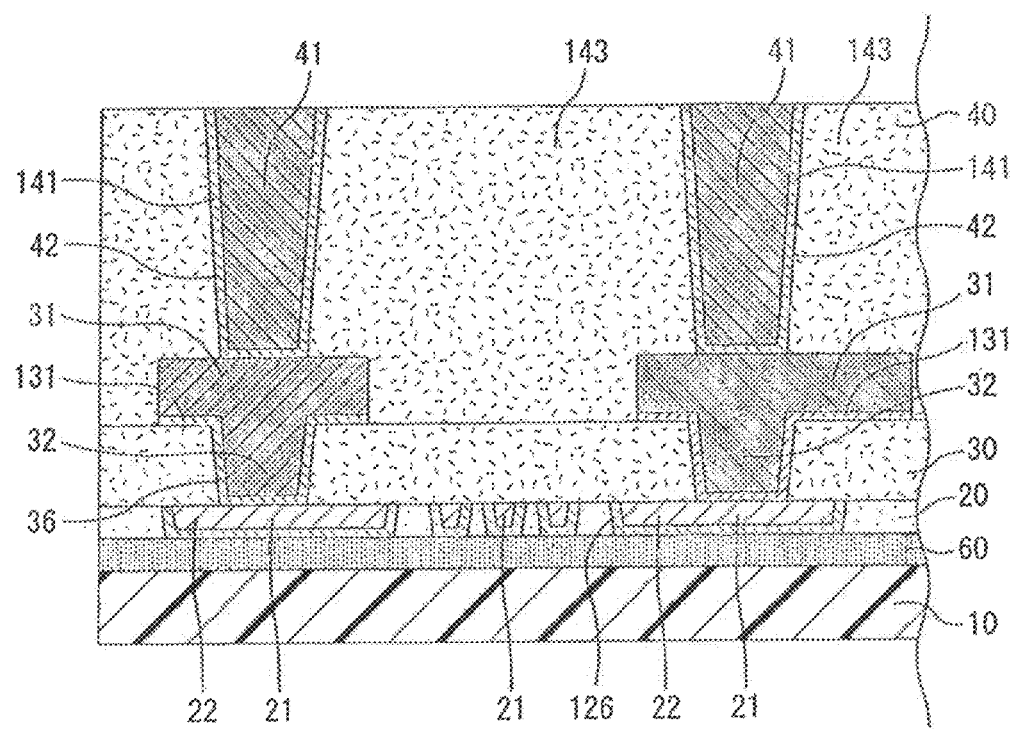
FIG. 14 is a schematic cross-sectional view partially showing steps of manufacturing an electronic component mounting substrate according to the second embodiment.

In the method for manufacturing an electronic component mounting substrate of the present embodiment, chemical mechanical polishing (CMP) is performed on a substrate where steps of the first embodiment have been taken to a stage in which electrolytic plated film is formed on support layer 40. FIGS. 13a, 13b and 14 are cross-sectional views schematically showing parts of the steps for manufacturing an electronic component mounting substrate of the second embodiment.

First, in a substrate where steps of the first embodiment have been taken to a stage in which first conductive circuits 31 are formed, an organic insulation layer that will become support layer 40 is formed. Then openings 42 are formed in predetermined spots. The result of the steps taken so far is shown altogether in FIG. 13a. Next, as shown in FIG. 13b, seed layer 141 is formed in openings 42 formed in support layer 40. Electrolytic copper plating is further performed using seed layer 141 as a power-supply layer to form electrolytic copper-plated layer 142 in openings 42 and on support layer 40.

Next, as shown in FIG. 14, CMP is performed to remove electrolytic copper-plated layer 142, and to remove seed layer 141 from the surface of support layer 40. Removing electrolytic copper-plated layer 142 and seed layer 141 is not limited to CMP, but other methods such as etching may also be used.

In an electronic component mounting substrate of the present embodiment, as shown in FIG. 12, steps may be taken so that protective film 50 is further formed on the second surface of support layer 40, openings 53 are formed in predetermined spots of protective film 50, and barrier-metal layer 54 and bumps 51 are formed in openings 53.

Also, after support substrate 10 is removed, steps may be taken so that openings 64 are formed in predetermined spots of protective film 60, and barrier-metal layer 65 and bumps 61 are formed in openings 64. By such steps, an electronic component mounting substrate of the present embodiment may be manufactured as shown in FIG. 12.

In an electronic component mounting substrate of the present embodiment, effects (1)-(9) as described in the first embodiment may be achieved, and the following effect may further be achieved.

(10) According to the present embodiment, lands 55 are not formed as in the first embodiment. Thus, the region to distribute the third conductive circuits will increase by the sizes of lands 55. As a result, distribution of third conductive circuits will become easier.

Third Embodiment

An electronic component mounting substrate of the present embodiment is structured so that multiple electronic components may be mounted, and among such multiple electronic components, specified electronic components may be connected by means of first conductive circuits and second conductive circuits.

Figure 15:
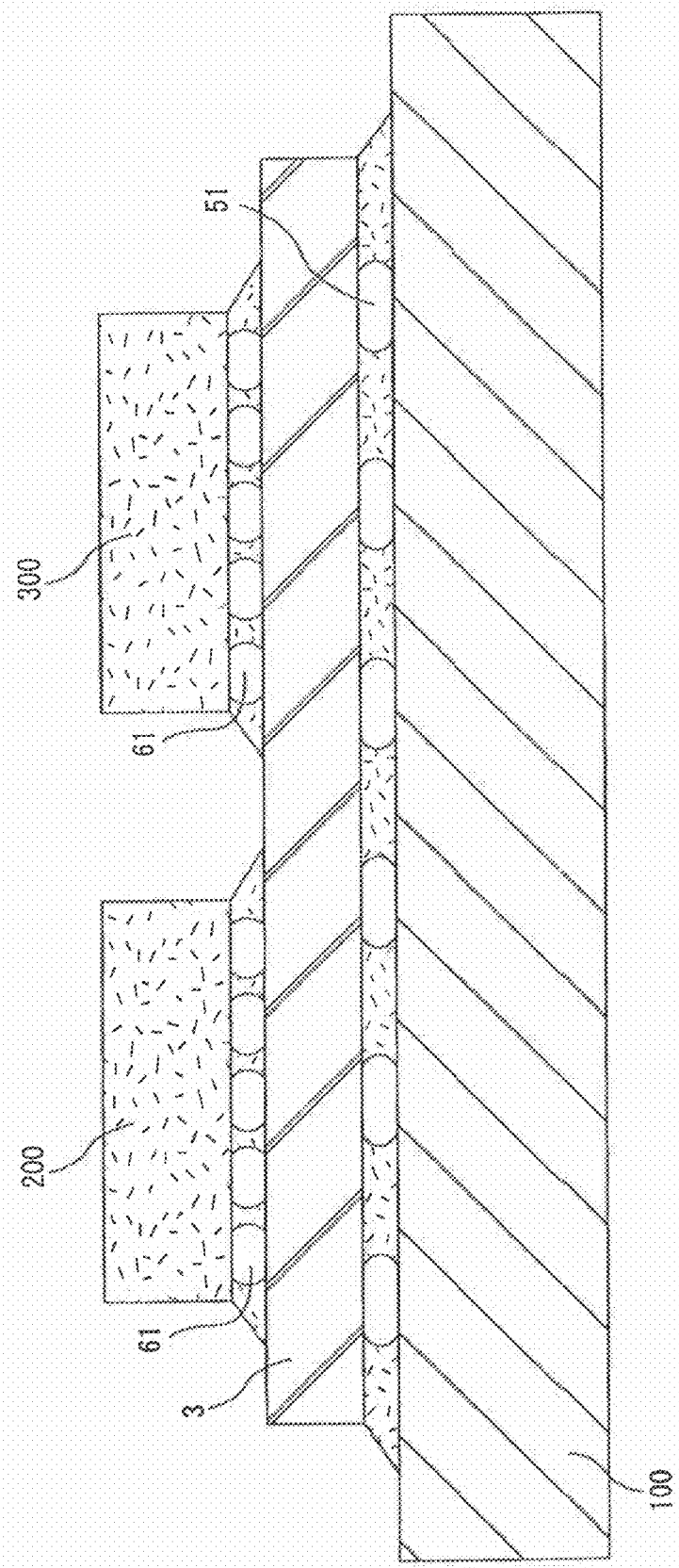
FIG. 15 is a schematic cross-sectional view partially showing yet another example of an electronic component mounting substrate of the present invention.

FIG. 15 is a cross-sectional view schematically showing part of yet another example of an electronic component mounting substrate of the present invention. On electronic component mounting substrate 3, multiple electronic components 200, 300 may be mounted as shown in FIG. 15.

Functions and mounting methods of electronic components 200, 300 used in the present embodiment are not limited to anything specific. In the present embodiment, electronic component 200 is a power-source regulator module, and electronic component 300 is a CPU.

In an electronic component mounting substrate of the present embodiment, effects (1)-(10) described in the first and second embodiments may be achieved.

Fourth Embodiment

In an electronic component mounting substrate of the present embodiment, a capacitor is formed on the first surface of an organic insulation layer.

Figure 16:
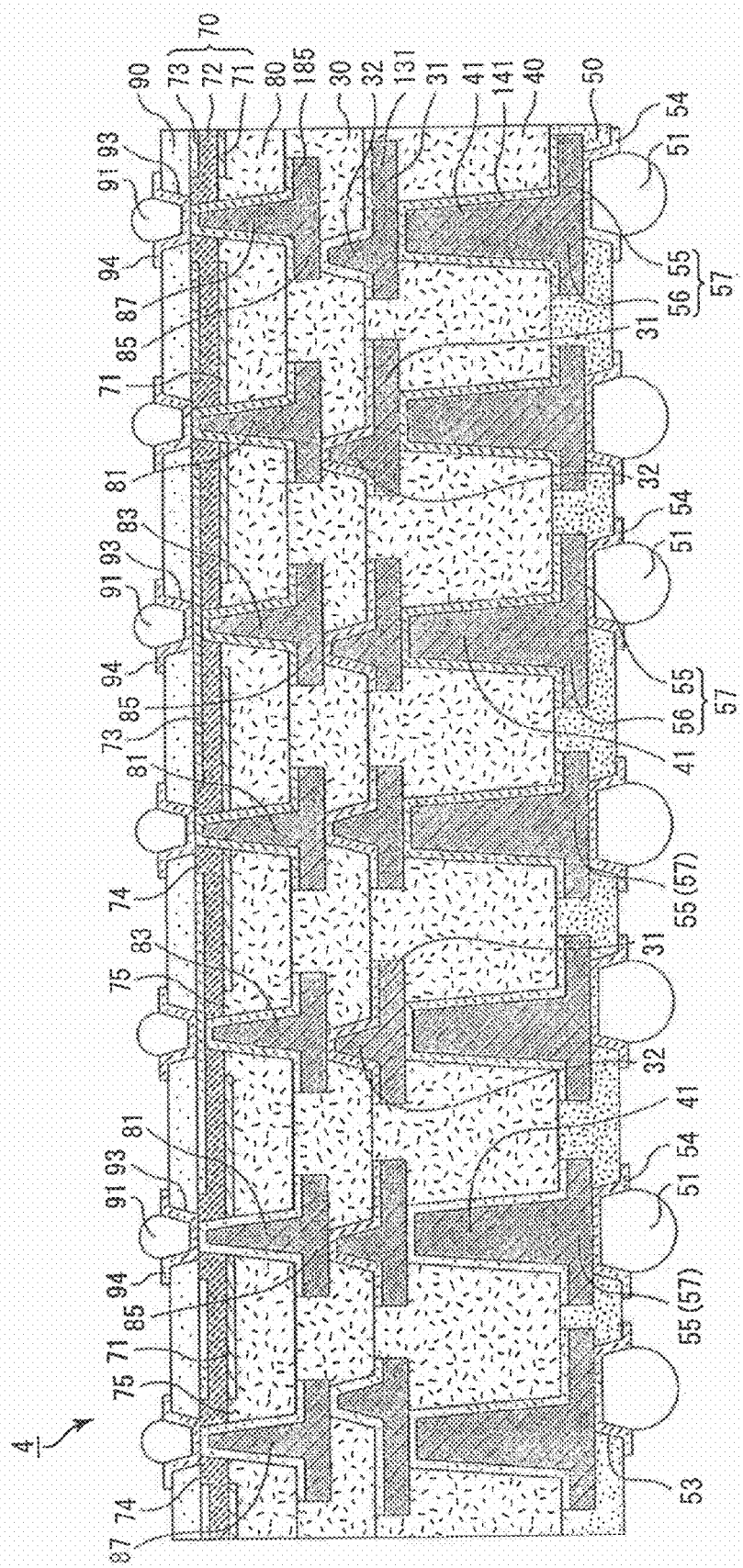
FIG. 16 is a schematic cross-sectional view partially showing yet another example of an electronic component mounting substrate of the present invention.

FIG. 16 is a cross-sectional view schematically showing part of yet another example of an electronic component mounting substrate of the present invention.

In electronic component mounting substrate 4 of the present embodiment, two organic insulation layers are formed (organic insulation layer 30 and organic insulation layer 80 formed on the first surface of organic insulation layer 30). Capacitor 70 is formed on the first surface of organic insulation layer 80.

Capacitor 70 is formed with lower electrode 71, dielectric layer 72 and upper electrode 73. Lower electrode 71 is electrically connected to lands 85 formed on the second surface of organic insulation layer 80 by means of second conductors 81 that penetrate organic conductive layer 80 and are connected to bumps for ground (may also be for power source). Upper electrode 73 is electrically connected to lands 85 formed on the second surface of organic insulation layer 80 by means of first conductors 83 that penetrate organic conductive layer 80 and are connected to bumps for power source (may also be for ground). Lands 85 are electrically connected to first conductive circuits 31 by means of via conductors 32 formed inside organic insulation layer 30. Namely, lower electrode 71 and upper electrode 73 are both electrically connected to first conductive circuits 31.

Upper electrode 73 is a plain pattern formed on the upper surface of dielectric layer 72 and has opening portions 74 which allow second conductors 81 and signal conductors 87 to pass without touching upper electrode 73. A dielectric substance made of the same material used for dielectric layer 72 is filled in opening portions 74.

Upper electrode 73 is positioned directly under openings 93 in protective film 90 which is formed on the first surface of capacitor 70. In openings 93 of protective film 90, barrier-metal layer 94 is formed and bumps 91 are further formed. An electronic component may be mounted on bumps 91.

Lower electrode 71 is a plain pattern formed on the lower surface of dielectric layer 72 and has opening portions 75 which allow first conductors 83 to pass without touching lower electrode 71. Resin made of the same material as used for organic insulation layer 80 is filled in opening portions 75. Lower electrode 71 is formed on the first surface of organic insulation layer 80.

As the material for lower electrode 71 and upper electrode 73, at least one kind selected from among a group of the following is used: TiN, TaN, Cu, Ni, Co, Ru, Ir, Au, Mo, W, Al, Ta and Ti. As a method for forming lower electrode 71 and upper electrode 73, sputtering, vacuum deposition or the like may be used.

Dielectric layer 72 is a layer formed between upper electrode 73 and lower electrode 71. As the material for dielectric layer 72, single metal oxides such as $Ta_2O_5$, $ZrO_2$, $HfO_2$ or the like, and $SrTiO_3$, $BaTiO_3$, $PbTiO_3$ or the like may be used. As for a method for forming dielectric layer 72, for example, chemical vapor deposition (CVD) is used. Among those, single metal oxides such as $Ta_2O_5$, $ZrO_2$, $HfO_2$ or the like are preferred, since such material has fewer lattice defects and thus leak current may be suppressed between upper electrode 73 and lower electrode 71.

In the present embodiment, it is preferred that the distance between upper electrode 73 and lower electrode 71 be set at 10 μm or less so that short circuiting will not occur between upper electrode 73 and lower electrode 71. With sufficiently small distance between electrodes, the capacitance of the capacitor may be increased.

Also, in an electronic component mounting substrate of the present embodiment, signal conductors 87 for signal current are formed. In FIG. 16, signal conductors 87 are formed on the left and right ends of electronic component mounting substrate 4. Signal conductors 87 penetrate organic insulation layer 80, opening portions 75, dielectric layer 72 and openings portions 74, and electrically connect bumps 91 and lands 85. Signal conductors 87 are not electrically connected to upper electrode 73 or lower electrode 71.

The material for organic insulation layer 80 is the same as for organic insulation layer 30 of the first embodiment. Also, as the material for protective film 90, the same material ($SiO_2$ and/or $Si_3N_4$) for inorganic insulation layer 20 and protective film 60 may be used.

Also, second conductors 81, first conductors 83 and signal conductors 87 which penetrate organic insulation layer 80 as well as lands 85 formed on the second surface of organic insulation layer 80 are made of copper plating and a seed layer under the copper plating.

Also, in FIG. 16, organic insulation layer 30 and each layer positioned under organic insulation layer 30 are formed the same as in the electronic component mounting substrate according to the first embodiment. Thus, their detailed descriptions are omitted here.

In the following, a method for manufacturing an electronic component mounting substrate according to the present embodiment is described with reference to the drawings.

FIGS. 17a, 17b and 17c, FIGS. 18a, 18b and 18c and FIG. 19 are cross-sectional views schematically showing parts of the steps for manufacturing an electronic component mounting substrate according to the fourth embodiment.

Figure 17:
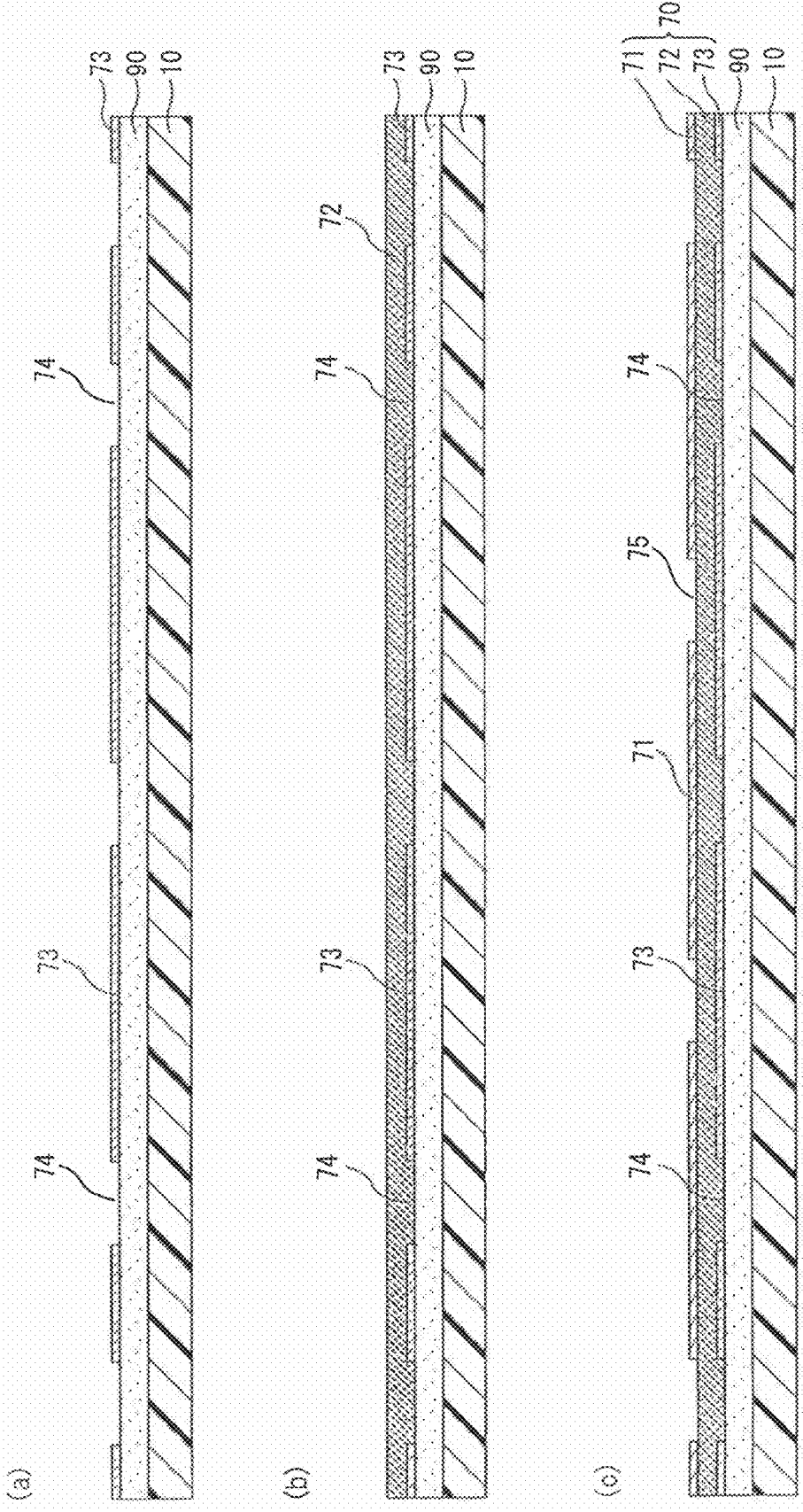
FIGS. 17a, 17b and 17c are schematic cross-sectional views partially showing steps of manufacturing an electronic component mounting substrate according to the fourth embodiment.

First, as shown in FIG. 17a, $SiO_2$ layer 90 is formed on support substrate 10. $SiO_2$ layer 90 will become protective film 90. As for support substrate 10 of the present embodiment, a silicon wafer is used the same as in the method for manufacturing an electronic component mounting substrate in the first embodiment, and $SiO_2$ layer 90 is formed on the upper surface of support substrate 10 by a chemical vapor deposition method (CVD).

In addition, a metal film (TiN) that will become upper electrode 73 is formed on the surface of $SiO_2$ layer 90 by sputtering, for example. Then, opening portions 74 are formed by patterning, and the surface of $SiO_2$ layer 90 is partially exposed. Such patterning may be conducted by, for example, dry etching such as reactive ion etching (RIE) or the like, or wet etching using a predetermined etchant.

Next, as shown in FIG. 17b, a layer made of a single metal oxide such as $Ta_2O_5$, $ZrO_2$, $HfO_2$ or the like is formed by CVD or the like to form dielectric layer 72. Furthermore, as shown in FIG. 17c, metal film (TiN) that will become lower electrode 71 is formed by sputtering on dielectric layer 72. Then, opening portions 75 are formed by patterning to partially expose the surface of dielectric layer 72. Such patterning may be conducted by, for example, dry etching such as reactive ion etching (RIE) or the like, or wet etching using a predetermined etchant.

Figure 18:
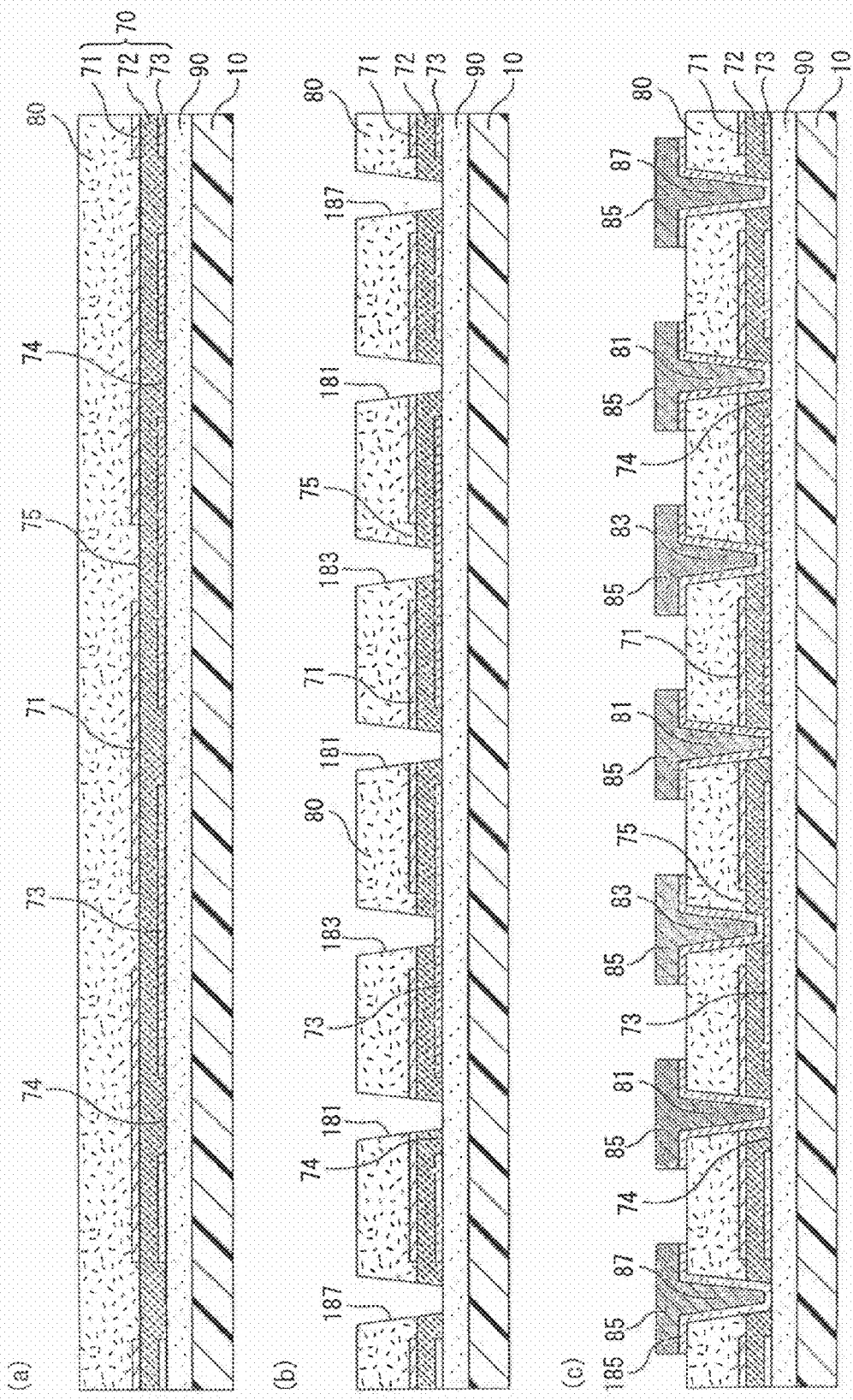
FIGS. 18a, 18b and 18c are schematic cross-sectional views partially showing steps of manufacturing an electronic component mounting substrate according to the fourth embodiment.

Next, as shown in FIG. 18a, organic insulation layer 80 is formed on lower electrode 71 and dielectric layer 72. Furthermore, as shown in FIG. 18b, openings 181, 183, 187 are formed by laser or RIE. Openings 181 and openings 187 are those for exposing $SiO_2$ layer 90; and openings 183 are those for exposing upper electrode 73.

Next, as shown in FIG. 18c, seed layer 185 is formed by sputtering. As for seed layer 185, the same material as seed layer 131 in the first embodiment may be used. Next, following the same steps that formed first conductive circuits 31 in the first embodiment, each step is conducted for forming plating resist, exposure and development, electrolytic copper plating using seed layer 185 as the power-supply layer, and removing the plating resist. Accordingly, second conductors 81, first conductors 83 and signal conductors 87, and lands 85 are formed. Second conductors 81 and lower electrode 71, and first conductors 83 and upper electrode 73 are electrically connected respectively. Signal conductors 87 are not electrically connected to either lower electrode 71 or upper electrode 73.

Figure 19:
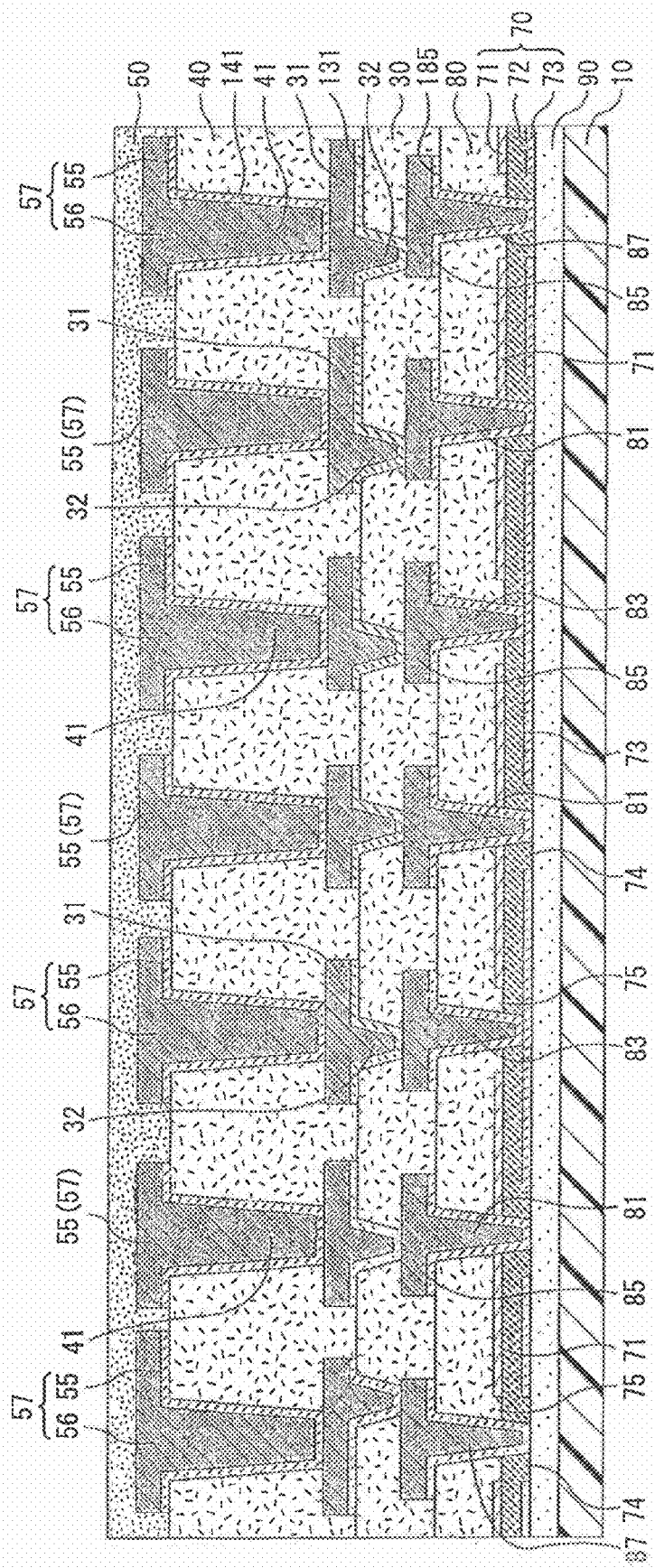
FIG. 19 is a schematic cross-sectional view partially showing steps of manufacturing an electronic component mounting substrate according to the fourth embodiment.

In the following, as shown in FIG. 19, each layer positioned on and above organic insulation layer 30 is formed. Such steps are the same as those described in the first embodiment. Thus, their detailed descriptions are omitted here.

In the following, steps are taken to remove support substrate 10 and to form openings in protective film 50 and $SiO_2$ layer 90 (protective film 90). Furthermore, steps are conducted to form bumps in the openings on the first-surface side and the second-surface side. By such steps, electronic component mounting substrate 4 is manufactured as shown in FIG. 16. Since those steps are the same steps as described in the first embodiment, their detailed descriptions are omitted here.

In an electronic component mounting substrate of the present embodiment, effects (1)-(10) as described in the first and second embodiments may be achieved, and the following effects may further be achieved.

(11) In the electronic component mounting substrate of the present embodiment, a capacitor is formed, and when a semiconductor element is mounted, the capacitor will be positioned directly under the semiconductor element. Thus, using the shortest distance, a power source will be supplied instantly to the semiconductor element, and decoupling effects may be achieved. As a result, malfunctions of the semiconductor element may be prevented.

(12) In the electronic component mounting substrate of the present embodiment, the dielectric layer of the capacitor is formed by CVD. Since the thickness of the dielectric layer is small, a thin-film capacitor with high capacitance may be obtained.

Fifth Embodiment

In an electronic component mounting substrate of the present embodiment, a capacitor is formed on the first surface of an organic insulation layer; and an inorganic insulation layer and second conductive circuits are formed on the first surface of the capacitor.

Figure 20:
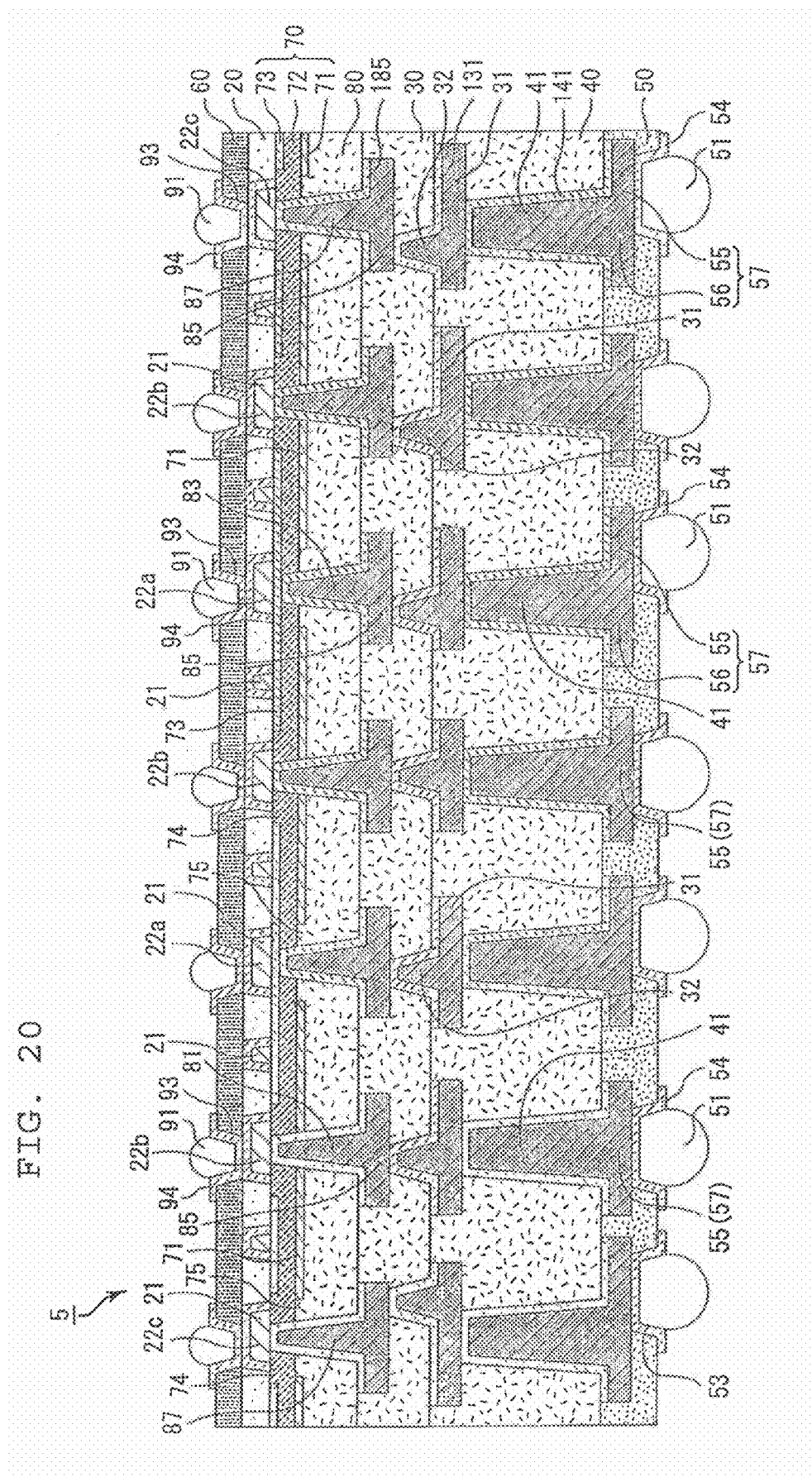
FIG. 20 is a schematic cross-sectional view partially showing yet another example of an electronic component mounting substrate of the present invention.

FIG. 20 is a cross-sectional view schematically showing part of yet another example of an electronic component mounting substrate of the present invention.

In electronic component mounting substrate 5 of the present embodiment, capacitor 70 is formed on the first surface of organic insulation layer 80. The positional relationship between organic insulation layer 80 and capacitor 70 is the same as in the electronic component mounting substrate of the fourth embodiment. Then, on the first surface of capacitor 70, inorganic insulation layer 20, second conductive circuits 21, and pads (22a, 22b, 22c) are formed. $Si_3N_4$ layer 60, positioned on the first-surface side of inorganic insulation layer 20, is a layer that functions as protective film. In $Si_3N_4$ layer 60, openings 93 are formed, partially exposing pads 22. On pads (22a, 22b, 22c), bumps 91 are formed with barrier-metal layer 94 in between. Inorganic insulation layer 20 and second conductive circuits 21 are formed the same as in the electronic component mounting substrate of the first embodiment. Also, pads (22a, 22b, 22c) are formed the same as pads 22 in the electronic component mounting substrate of the first embodiment.

In the electronic component mounting substrate of the present embodiment, pads (22a) formed on upper electrode 73 function as power-source pads. In addition, pads (22b), positioned on opening portions 74 while being insulated from upper electrode 73, function as ground pads. Furthermore, pads (22c), positioned on both edges shown in FIG. 20 and insulated from either upper electrode 73 or lower electrode 71, function as signal pads.

Also, the rest of the areas shown in FIG. 20 are formed the same as those in the electronic component mounting substrate according to the first embodiment. Thus, their detailed descriptions are omitted here.

Figure 21:
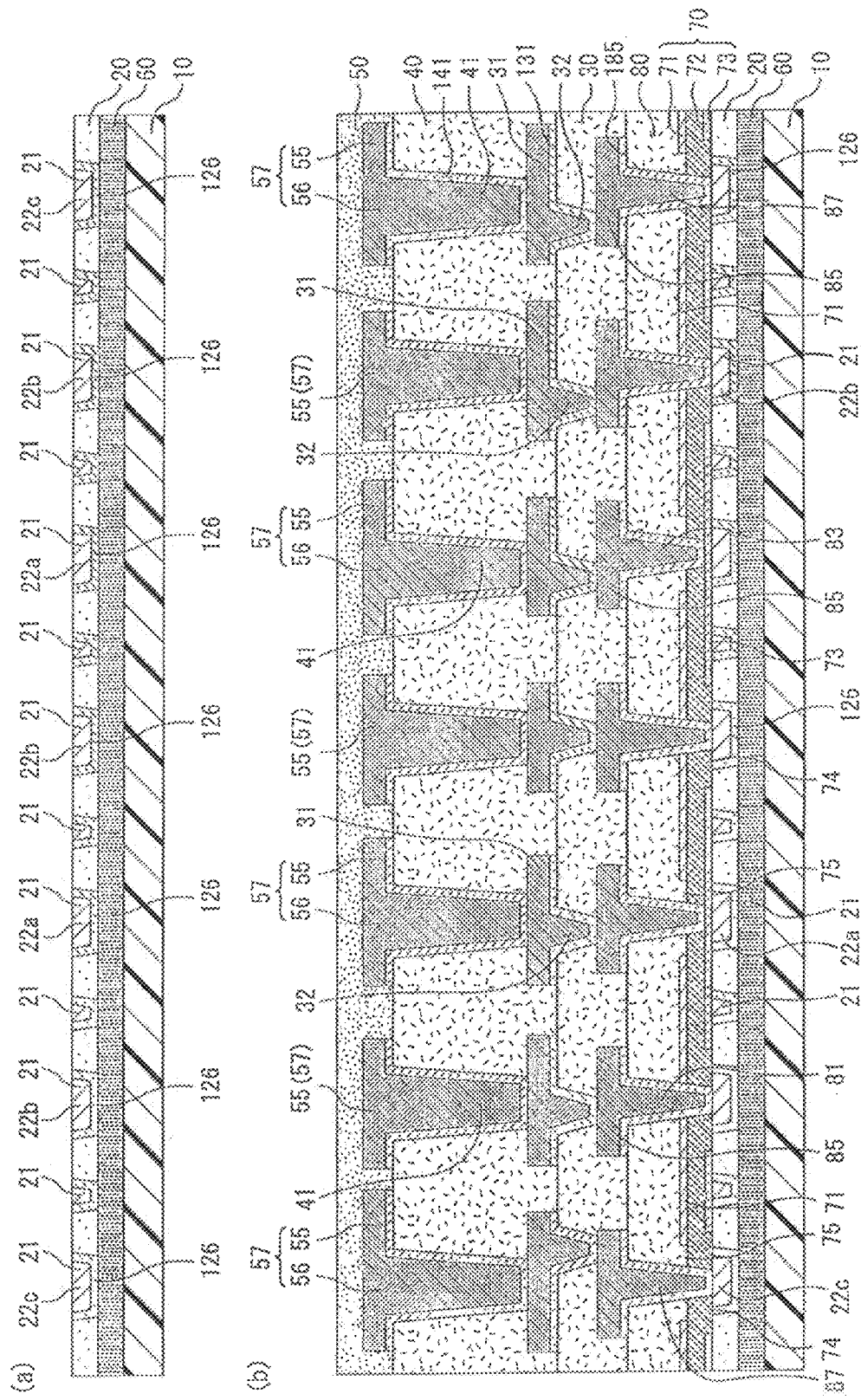
FIGS. 21a and 21b are schematic cross-sectional views partially showing steps for manufacturing an electronic component mounting substrate according to the fifth embodiment.

In the following, a method for manufacturing an electronic component mounting substrate of the present embodiment is described with reference to the drawings. FIGS. 21a and 21b are cross-sectional views schematically showing parts of the steps of manufacturing an electronic component mounting substrate according to the fifth embodiment.

FIG. 21a is the same view as FIG. 4d of the first embodiment. According to a method for manufacturing an electronic component mounting substrate of the present embodiment, first, $Si_3N_4$ layer 60, inorganic insulation layer 20, second conductive circuits 21 and pads (22a, 22b, 22c) are formed on support substrate 10 the same as in a method for manufacturing an electronic component mounting substrate of the first embodiment.

Next, a step is conducted to form metal film (TiN) that will become upper electrode 73 on inorganic insulation layer 20, second conductive circuits 21 and pads (22a, 22b, 22c). Then, following the same steps to form a capacitor as in the method for manufacturing an electronic component mounting substrate of the fourth embodiment, capacitor 70 is formed. Furthermore, each layer located above organic insulation layer 80 is formed. The result of the steps so far is shown altogether in FIG. 21b.

After that, the same as in the method for manufacturing an electronic component mounting substrate of the fourth embodiment, electronic component mounting substrate 5 may be manufactured as shown in FIG. 20.

In an electronic component mounting substrate of the present embodiment, effects (1)-(12) as described in the first, second and fourth embodiments may be achieved.

Other Embodiments

In the above-described electronic component mounting substrate in each embodiment, first conductive circuits are formed on the second surface of an organic insulation layer, which makes contact with the first surface of the support layer. However, first conductive circuits may be formed inside the organic insulation layer on its second-surface side. "Inside the organic insulation layer on its second-surface side" indicates a region which is located inside the organic insulation layer and near its second-surface side; more specifically, it indicates a region that is positioned closer to the second-surface side than to the cut section when the organic insulation layer was cut in half in the direction of its thickness.

In an electronic component mounting substrate of the present invention, at least either a power-source layer or a ground layer may be formed inside an inorganic insulation layer or on the second surface of an inorganic insulation layer (inside the organic insulation layer positioned closest to the inorganic insulation layer).

For example, if a ground layer is formed inside the inorganic insulation layer, a microstrip structure is formed including first conductive circuits located directly under the ground layer. As a result, characteristic impedance may be matched, and signal transmission may be stabilized.

In an electronic component mounting substrate of the present invention, multiple organic insulation layers and/or inorganic insulation layers may be formed to make first conductive circuits and/or second conductive circuits with multilayer wiring. When multiple organic insulation layers are formed, via conductors and/or conductive circuits are formed inside each organic insulation layer. However, inside the organic insulation layer that is positioned closest to the inorganic insulation layer, it is especially preferred that only via conductors be formed, and conductive circuits not be formed.

The material for forming conductive posts, first conductive circuits and second conductive circuits is not limited to anything specific as long as it is conductive. Tungsten, nickel, gold, silver or the like may be used rather than copper.

As the material for organic insulation layers, thermosetting resins such as the following are used, for example: epoxy resin, phenol resin, polyimide resin, polyester resin, bismaleimide resin, polyolefin resin, polyphenyleneether resin, polyphenylene resin and fluorocarbon resin. Also, as for photosensitive resins, for example, acrylic resin or the like is used.

As for thermosetting resins which include photosensitive groups, resins such as those in which the thermosetting group of the above thermosetting resin has reacted with methacryl acid or acrylic acid may be used.

Also, thermoplastic resins are, for example, as follows: phenoxy resin, polyether sulfone (PES), polysulfone (PSF), polyphenylene sulfone (PPS), polyphenylene sulfide (PPES), polyphenyleneether (PPE) and polyether imide (PI).

Also, specific combinations of resin compounds to be used as organic insulation layers are as follows, for example: phenol resin/polyether sulfone, polyimide resin/polysulfone, epoxy resin/polyether sulfone, epoxy resin/phenoxy resin, acrylic resin/phenoxy resin, and epoxy resin, part of whose epoxy group has reacted with acryl/polyether sulfone.

The type and function of an electronic component mounted on an electronic component mounting substrate of the present invention are not limited to anything specific. Also, the number of such electronic components and their mounting methods are not limited specifically. In addition, multiple electronic components may be laminated and then mounted. In such a case, for example, penetrating electrodes formed in each electronic component are connected to each other by means of bumps.

In a method for manufacturing an electronic component mounting substrate of the present invention, the kind of resist which is formed on an inorganic insulation layer and which is used when forming second conductive circuits by a damascene method, and a method for exposing and developing such a resist are not limited to anything specific, as long as they are used in the steps of manufacturing semiconductors.

As for forming a seed layer on an inorganic insulation layer and an organic insulation layer, other than sputtering, so-called physical vapor deposition (PVD) methods may be used. Specifically, methods such as vacuum deposition, ion plating or electron beam deposition may be used. Also, a conventional method known for forming conductive circuits by a semi-additive method may be used when forming a seed layer on an organic insulation layer.

Forming organic insulation layers is not limited to any specific method, but the following may be used: a method for applying uncured resin by spin coater, curtain coater or the like; and a method for forming resin layers by thermopressing resin film. In addition, a method for curing resin is not limited to thermosetting.

Also, when forming openings in an organic insulation layer, methods for forming openings by exposure and development, or by laser processing may be used. As for such laser processing, excimer laser, UV-YAG laser, carbon dioxide gas laser or the like may be used.

When describing the above embodiments, silicon was used for support substrates. However, instead of silicon, support substrates made of glass, ceramics or metal may also be used.

In the fourth and fifth Embodiments, as a method for forming upper electrode 73 and lower electrode 71, other than sputtering, the following may be listed: chemical vapor deposition including metal organic CVD (MOCVD), or atomic layer deposition (ALD), or physical vapor deposition (PVD) (such as vacuum deposition, ion plating and electron beam deposition).

An electronic component mounting substrate whose mounting reliability is high when a semiconductor element having a narrow electrode pitch is mounted on one surface is provided, and the other surface is used to mount the substrate on a printed wiring board. Also, an electronic component mounting substrate without a silicon substrate so as to decrease the mounting height is provided. In addition, a method for manufacturing an electronic component mounting substrate with such features is provided.

Namely, the electronic component mounting substrate may be an electronic component mounting substrate arranged between a printed wiring board and an electronic component, characterized by the following: a support layer made of resin; at least one organic insulation layer formed on a first surface of the support layer; a first conductive circuit which is formed on a second surface of the organic insulation layer, the surface being in contact with the first surface of the support layer, or which is formed inside the second-surface side of the organic insulation layer; an inorganic insulation layer formed on a first surface positioned opposite the second surface of the organic insulation layer; a second conductive circuit formed inside the inorganic insulation layer; formed inside the inorganic insulation layer, a pad for mounting the electronic component; a via conductor formed inside the organic insulation layer and electrically connecting the second conductive circuit and the first conductive circuit; a conductor formed on a second-surface side positioned opposite the first surface of the support layer; and a conductive post formed inside the support layer and electrically connecting the first conductive circuit and the conductor.

In the electronic component mounting substrate, a support layer made of resin may be formed, and a conductive post may be formed in the support layer.

Then, on the second-surface side of the support layer in the electronic component mounting substrate, the electronic component mounting substrate may be mounted on a printed wiring board. Thus, stress generated due to different thermal expansion coefficients between the electronic component mounting substrate and the printed wiring board may be relieved by the conductive post. Accordingly, for example, stress seldom concentrates on bumps used for mounting the electronic component mounting substrate on the printed wiring board. Therefore, cracks may be suppressed in bumps. As a result, mounting reliability of the electronic component mounting substrate may be ensured.

On the other hand, on the first-surface side of the support layer, an organic insulation layer is formed and an inorganic insulation layer is further formed on the organic insulation layer. Inside the inorganic insulation layer, pads for mounting an electronic component are formed. The pads are wired by fine wiring using second conductive circuits formed inside the inorganic insulation layer, and are made fine-pitched. Accordingly, electronic components, especially semiconductor elements having fine-pitch terminals (electrodes) may be mounted on the pads formed inside the inorganic insulation layer.

Also, since fine wiring may be formed inside the inorganic insulation layer, by forming fine wiring using the second conductive circuits in the inorganic insulation layer, it is not necessary to increase the number of layers to gradually fan out the wiring. Accordingly, fine-pitch terminals of an electronic component may be dealt with using fewer layers.

Also, since electronic components such as semiconductor elements are usually made from inorganic material such as silicon, when an electronic component is mounted on an electronic component mounting substrate to be positioned near the inorganic insulation layer, the difference in the thermal expansion coefficients between the electronic component and the electronic component mounting substrate is small, thus the mounting reliability increases.

In the electronic component mounting substrate, the aspect ratio of the conductive post may be in the range of 4.0-6.5. If formed to be such, stress generated due to the difference in thermal expansion coefficients between the electronic component mounting substrate and the printed wiring board may be easily relieved.

In the electronic component mounting substrate, the thickness of the first conductive circuit may be greater than that of the second conductive circuit. Also, in the electronic component mounting substrate, the cross section of the first conductive circuit may be greater than that of the second conductive circuit.

If the wiring that forms the first conductive circuit has a greater thickness or a greater cross section, the wiring resistance of the first conductive circuit becomes smaller than that of the second conductive circuit. Accordingly, compared with a case in which a semiconductor element and a printed wiring board are connected using only the wiring of the second conductive circuit in an inorganic insulation layer, the wiring resistance may decrease in the entire electronic component mounting substrate.

In the electronic component mounting substrate, only a via conductor may be formed, and a conductive circuit is not formed in the organic insulation layer positioned closest to the inorganic insulation layer.

The organic insulation layer positioned closest to the inorganic insulation layer (outermost organic insulation layer) tends to receive the biggest effect from the thermal history caused by the heat in the electronic component. As a result, if a conductive circuit is formed in the outermost organic insulation layer, due to the difference in thermal expansion coefficients between the metal that forms the conductive circuit and the organic insulation layer, cracks may likely occur originating in edge portions of the conductive circuit, for example. However, if formed as described above, such cracks seldom occur, since no conductive circuit is formed inside the outermost organic insulation layer.

In the electronic component mounting substrate, the via conductor may have a side surface whose cross section tapers from the second surface of the organic insulation layer toward the first surface. If formed as such, the apex of the via conductor is configured to be gradual (obtuse angle). Accordingly, for example, if internal stress occurs in the organic insulation layer due to the heat generated in the electronic component, such stress will be suppressed from concentrating in the apex of via conductor. As a result, cracks originating in the apex of the via conductor may be effectively suppressed from occurring in the organic insulation layer.

In the electronic component mounting substrate, the support layer may be formed with a material whose Young's modulus at 30° C. is in the range of 10-1,000 MPa. If the Young's modulus of a support layer is in such a range, by arranging such a support layer, the strength of the electronic component mounting substrate may be excellently maintained.

The method for manufacturing an electronic component mounting substrate may be characterized by the following: forming an inorganic insulation layer on a support substrate; forming a second conductive circuit and a pad inside the inorganic insulation layer; forming at least one organic insulation layer on the inorganic insulation layer; forming a first conductive circuit inside the organic insulation layer or on the organic insulation layer, while forming a via conductor electrically connecting the second conductive circuit and the first conductive circuit; forming a support layer on the organic insulation layer; forming a conductor on the support layer; while forming inside the support layer a conductive post electrically connecting the conductor and the first conductive circuit; and removing the support substrate.

Following such steps, an electronic component mounting substrate may be manufactured, characterized by high mounting reliability when mounting a semiconductor element with fine-pitch terminals (electrodes) on one side and mounting a printed wiring board on the other side.

In the method for manufacturing an electronic component mounting substrate, the first conductive circuit may be formed by a semi-additive method. Using a semi-additive method, a first conductive circuit whose wiring resistance per unit length is smaller than the second conductive circuit may be formed easily and inexpensively.

In the method for manufacturing an electronic component mounting substrate, after an opening exposing part of the first conductive circuit is formed inside the support layer, a conductive post may be formed in the opening. Using such a step, even if a conductive post has a large aspect ratio, it may be formed well.

In the method for manufacturing an electronic component mounting substrate, the second conductive circuit may be formed by a damascene method. By using a damascene method, a second conductive circuit for making fine wiring distribution may be accurately manufactured. Moreover, wiring with highly flat features may also be formed.

The electronic component mounting substrate may be an electronic component mounting substrate arranged between a printed wiring board and an electronic component, which is characterized by the following: a support layer made of resin; at least one organic insulation layer formed on a first surface of the support layer; a first conductive circuit which is formed on a second surface of the organic insulation layer, the surface being in contact with the first surface of the support layer, or which is formed inside on the second-surface side of the organic insulation layer; a capacitor formed on a first surface positioned opposite the second surface of the organic insulation layer; a conductor formed on a second-surface side positioned opposite the first surface of the support layer; and a conductive post formed inside the support layer and electrically connecting the first conductive circuit and the conductor.

In such an electronic component mounting substrate, the capacitor is formed with a lower electrode having an opening portion, a dielectric layer formed on the lower electrode, and an upper electrode formed on the dielectric layer and having an opening portion; and either the lower electrode or the upper electrode is connected to a power-source line of a semiconductor element, and the other is connected to a ground line.

If formed as such, when a semiconductor element is mounted, the capacitor will be positioned directly under the semiconductor element. Therefore, it is possible to supply a power source instantly to the semiconductor element by way of the shortest distance, and thus a decoupling effect is achieved. As a result, malfunctioning of the semiconductor element may be prevented.

The electronic component mounting substrate may have a first conductor connected to the upper electrode by passing through the opening portion of the lower electrode, and a second conductor connected to the lower electrode by passing through the opening portion of the upper electrode.

In the electronic component mounting substrate, the dielectric layer may be made of a single metal oxide.

Obviously, numerous modifications and variations of the present invention are possible in light of the above teachings. It is therefore to be understood that within the scope of the appended claims, the invention may be practiced otherwise than as specifically described herein.

What is claimed is:

1. An electronic component mounting substrate comprising:
   a support layer comprising a resin and having a first surface and a second surface on an opposite side of the first surface;
   an organic insulation layer formed on the first surface of the support layer and having a first surface and a second surface, the first surface of the organic insulation layer being on an opposite side of the first surface of the support layer, the second surface of the organic insulation layer being in contact with the first surface of the support layer;
   an inorganic insulation layer formed on the first surface of the organic insulation layer;
   a conductor formed on the second surface of the support layer and positioned to be mounted to a printed wiring board; and
   a first conductive circuit formed on the second surface of the organic insulation layer,
   wherein the inorganic insulation layer has a second conductive circuit and a pad for mounting an electronic component which are formed inside the inorganic insulation layer, the organic insulation layer has a via conductor formed inside the organic insulation layer and electrically connecting the second conductive circuit in the inorganic insulation layer and the first conductive circuit, and the support layer has a conductive post formed inside the support layer and electrically connecting the first conductive circuit and the conductor.

2. The electronic component mounting substrate according to claim 1, wherein the conductive post has an aspect ratio in a range of 4.0-6.5.

3. The electronic component mounting substrate according to claim 1, wherein the first conductive circuit has a thickness which is greater than a thickness of the second conductive circuit.

4. The electronic component mounting substrate according to claim 1, wherein the conductive circuit has a cross section which is greater than a cross section of the second conductive circuit.

5. The electronic component mounting substrate according to claim 1, further comprising a second organic insulation layer formed closest to the inorganic insulation layer, wherein the second organic insulation layer has a via conductor formed inside the organic insulation layer.

6. The electronic component mounting substrate according to claim 1, wherein the via conductor has a side surface whose cross section tapers from the second surface of the organic insulation layer toward the first surface of the organic insulation layer.

7. The electronic component mounting substrate according to claim 1, wherein the resin of the support layer has Young's modulus at 30° C. in a range of 10-1,000 MPa.

* * * * *